(12) United States Patent
Ibe et al.

(10) Patent No.: US 8,941,301 B2
(45) Date of Patent: Jan. 27, 2015

(54) LIGHT-EMITTING ELEMENT, LIGHT-EMITTING DEVICE, ELECTRONIC DEVICE, AND METHOD FOR FABRICATING LIGHT-EMITTING ELEMENT

(75) Inventors: Takahiro Ibe, Atsugi (JP); Hisao Ikeda, Isehara (JP); Junichi Koezuka, Isehara (JP); Kaoru Kato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 50 days.

(21) Appl. No.: 13/584,116

(22) Filed: Aug. 13, 2012

(65) Prior Publication Data

US 2012/0305907 A1    Dec. 6, 2012

Related U.S. Application Data

(62) Division of application No. 12/213,615, filed on Jun. 23, 2008, now Pat. No. 8,253,327.

(30) Foreign Application Priority Data

Jun. 28, 2007    (JP) .................. 2007-170319

(51) Int. Cl.
*H01L 51/50*    (2006.01)
*H01L 51/52*    (2006.01)
(Continued)

(52) U.S. Cl.
CPC ......... *H01L 51/5237* (2013.01); *H01L 27/3244* (2013.01); *H01L 51/0042* (2013.01);
(Continued)

(58) Field of Classification Search
USPC .................................. 313/512, 504
See application file for complete search history.

(56) References Cited

U.S. PATENT DOCUMENTS

| 4,599,538 A | 7/1986 | Hidler et al. |
| 5,107,175 A | 4/1992 | Hirano et al. |

(Continued)

FOREIGN PATENT DOCUMENTS

| EP | 0 855 848 | 7/1998 |
| EP | 0 948 063 | 10/1999 |

(Continued)

OTHER PUBLICATIONS

Tsutsui et al., "Electroluminescence in Organic Thin Films," Photochemical Processes in Organized Molecular Systems, 1991, pp. 437-450.

(Continued)

*Primary Examiner* — Mary Ellen Bowman
(74) *Attorney, Agent, or Firm* — Eric J. Robinson; Robinson Intellectual Property Law Office, P.C.

(57) ABSTRACT

Objects of the present invention are to provide a light-emitting element that does not readily deteriorate, a light-emitting device and an electronic device that do not readily deteriorate, and a method of fabricating the light-emitting element that does not readily deteriorate. A light-emitting element having an EL layer between a pair of electrodes is covered with a layer containing an inorganic compound and halogen atoms or a layer containing an organic compound, an inorganic compound, and halogen atoms, whereby deterioration by moisture penetration can be inhibited. Thus, a light-emitting element with a long life can be obtained.

21 Claims, 8 Drawing Sheets

(51) Int. Cl.
*H01L 27/32* (2006.01)
*H01L 51/00* (2006.01)

(52) U.S. Cl.
CPC ......... *H01L51/0052* (2013.01); *H01L 51/0053* (2013.01); *H01L 51/0054* (2013.01); *H01L 51/0055* (2013.01); *H01L 51/0056* (2013.01); *H01L 51/0059* (2013.01); *H01L 51/006* (2013.01); *H01L 51/0071* (2013.01); *H01L 51/0085* (2013.01); *H01L 51/0089* (2013.01)
USPC .......................................... 313/512; 313/504

(56) References Cited

U.S. PATENT DOCUMENTS

| | | |
|---|---|---|
| 5,124,204 A | 6/1992 | Yamashita et al. |
| 5,189,405 A | 2/1993 | Yamashita et al. |
| 5,343,052 A | 8/1994 | Oohata et al. |
| 5,518,824 A | 5/1996 | Funhoff et al. |
| 5,550,066 A | 8/1996 | Tang et al. |
| 5,652,067 A | 7/1997 | Ito et al. |
| 5,684,365 A | 11/1997 | Tang et al. |
| 5,686,360 A | 11/1997 | Harvey et al. |
| 5,693,956 A | 12/1997 | Shi et al. |
| 5,757,126 A | 5/1998 | Harvey et al. |
| 5,771,562 A | 6/1998 | Harvey et al. |
| 5,811,177 A | 9/1998 | Shi et al. |
| 5,817,366 A | 10/1998 | Arai et al. |
| 5,821,138 A | 10/1998 | Yamazaki et al. |
| 5,909,081 A | 6/1999 | Eida et al. |
| 5,952,708 A | 9/1999 | Yamazaki |
| 5,952,778 A | 9/1999 | Haskal et al. |
| 5,953,094 A | 9/1999 | Matsuoka et al. |
| 5,962,962 A | 10/1999 | Fujita et al. |
| 5,989,737 A | 11/1999 | Xie et al. |
| 5,990,542 A | 11/1999 | Yamazaki |
| 5,990,615 A | 11/1999 | Sakaguchi et al. |
| 5,990,629 A | 11/1999 | Yamada et al. |
| 6,013,384 A | 1/2000 | Kido et al. |
| 6,046,543 A | 4/2000 | Bulovic et al. |
| 6,049,167 A | 4/2000 | Onitsuka et al. |
| 6,118,212 A | 9/2000 | Nakaya et al. |
| 6,121,542 A | 9/2000 | Shiotsuka et al. |
| 6,121,726 A | 9/2000 | Codama et al. |
| 6,127,199 A | 10/2000 | Inoue et al. |
| 6,132,280 A | 10/2000 | Tanabe et al. |
| 6,146,225 A | 11/2000 | Sheats et al. |
| 6,150,187 A | 11/2000 | Zyung et al. |
| 6,160,346 A | 12/2000 | Vleggaar et al. |
| 6,169,293 B1 | 1/2001 | Yamazaki |
| 6,172,459 B1 | 1/2001 | Hung et al. |
| 6,195,142 B1 | 2/2001 | Gyotoku et al. |
| 6,198,217 B1 | 3/2001 | Suzuki et al. |
| 6,198,220 B1 | 3/2001 | Jones et al. |
| 6,214,631 B1 | 4/2001 | Burrows et al. |
| 6,239,470 B1 | 5/2001 | Yamazaki |
| 6,268,695 B1 | 7/2001 | Affinito |
| 6,274,887 B1 | 8/2001 | Yamazaki et al. |
| 6,323,924 B1 | 11/2001 | Matsuoka et al. |
| 6,372,608 B1 | 4/2002 | Shimoda et al. |
| 6,376,333 B1 | 4/2002 | Yamazaki et al. |
| 6,413,645 B1 | 7/2002 | Graff et al. |
| 6,423,429 B2 | 7/2002 | Kido et al. |
| 6,441,468 B1 | 8/2002 | Yamazaki |
| 6,445,059 B1 | 9/2002 | Yamazaki |
| 6,486,601 B1 | 11/2002 | Sakai et al. |
| 6,515,310 B2 | 2/2003 | Yamazaki et al. |
| 6,525,339 B2 | 2/2003 | Motomatsu |
| 6,559,594 B2 | 5/2003 | Fukunaga et al. |
| 6,582,876 B2 | 6/2003 | Wolk et al. |
| 6,589,673 B1 | 7/2003 | Kido et al. |
| 6,599,783 B2 | 7/2003 | Takatoku |
| 6,605,826 B2 | 8/2003 | Yamazaki et al. |
| 6,617,052 B2 | 9/2003 | Morii |
| 6,620,528 B1 | 9/2003 | Yamazaki et al. |
| 6,638,645 B2 | 10/2003 | Sawai et al. |
| 6,660,409 B1 | 12/2003 | Komatsu et al. |
| 6,664,732 B2 | 12/2003 | Yamazaki et al. |
| 6,710,542 B2 | 3/2004 | Chun et al. |
| 6,720,203 B2 | 4/2004 | Carcia et al. |
| 6,728,278 B2 | 4/2004 | Kahen et al. |
| 6,737,753 B2 | 5/2004 | Kumar et al. |
| 6,739,931 B2 | 5/2004 | Yamazaki et al. |
| 6,768,260 B2 | 7/2004 | Fukunaga et al. |
| 6,776,880 B1 | 8/2004 | Yamazaki |
| 6,777,621 B2 | 8/2004 | Ishikawa et al. |
| 6,792,333 B2 | 9/2004 | Yamazaki |
| 6,798,132 B2 * | 9/2004 | Satake .................... 313/495 |
| 6,803,127 B2 | 10/2004 | Su et al. |
| 6,806,638 B2 | 10/2004 | Lih et al. |
| 6,819,044 B2 | 11/2004 | Shirakawa et al. |
| 6,828,727 B2 | 12/2004 | Yamazaki |
| 6,831,298 B2 | 12/2004 | Park et al. |
| 6,833,668 B1 | 12/2004 | Yamada et al. |
| 6,835,950 B2 | 12/2004 | Brown et al. |
| 6,849,877 B2 | 2/2005 | Yamazaki et al. |
| 6,869,635 B2 | 3/2005 | Kobayashi |
| 6,891,330 B2 * | 5/2005 | Duggal et al. ............. 313/511 |
| 6,897,608 B2 | 5/2005 | Yamazaki et al. |
| 6,924,594 B2 | 8/2005 | Ogura et al. |
| 6,936,131 B2 | 8/2005 | McCormick et al. |
| 6,940,223 B2 | 9/2005 | Yamazaki |
| 6,963,168 B2 | 11/2005 | Eida et al. |
| 6,965,195 B2 | 11/2005 | Yamazaki et al. |
| 6,995,511 B2 | 2/2006 | Yamazaki et al. |
| 7,012,367 B2 | 3/2006 | Seki |
| 7,025,647 B2 | 4/2006 | Miyazawa |
| 7,034,456 B2 | 4/2006 | Yamazaki et al. |
| 7,038,377 B2 * | 5/2006 | Kobayashi et al. .......... 313/512 |
| 7,045,822 B2 | 5/2006 | Tsuchiya |
| 7,101,242 B2 | 9/2006 | Fukunaga et al. |
| 7,158,161 B2 | 1/2007 | Gyoutoku et al. |
| 7,187,121 B2 | 3/2007 | Hasegawa et al. |
| 7,202,504 B2 | 4/2007 | Ikeda et al. |
| 7,211,828 B2 | 5/2007 | Yamazaki et al. |
| 7,230,271 B2 | 6/2007 | Yamazaki et al. |
| 7,301,277 B2 | 11/2007 | Hayashi |
| 7,332,859 B2 | 2/2008 | Hasegawa et al. |
| 7,420,208 B2 | 9/2008 | Yamazaki et al. |
| 7,427,832 B2 | 9/2008 | Kobayashi |
| 7,452,738 B2 | 11/2008 | Hayashi et al. |
| 7,456,570 B2 | 11/2008 | Kawamura et al. |
| 7,459,849 B2 | 12/2008 | Yamazaki et al. |
| 7,488,985 B2 | 2/2009 | Tsuchiya |
| 7,514,868 B2 | 4/2009 | Yamazaki et al. |
| 7,572,478 B2 | 8/2009 | Ogura et al. |
| 7,683,535 B2 | 3/2010 | Fukunaga et al. |
| 7,692,378 B2 | 4/2010 | Yamazaki |
| 7,696,524 B2 | 4/2010 | Ikeda et al. |
| 7,728,326 B2 | 6/2010 | Yamazaki et al. |
| 7,745,993 B2 | 6/2010 | Fukunaga et al. |
| 7,790,296 B2 | 9/2010 | Kawakami et al. |
| 7,838,874 B2 | 11/2010 | Ibe et al. |
| 7,867,053 B2 | 1/2011 | Fukunaga et al. |
| 7,875,881 B2 | 1/2011 | Ikeda et al. |
| 7,883,788 B2 | 2/2011 | Kawakami et al. |
| 7,932,667 B2 | 4/2011 | Tsuchiya |
| 7,952,101 B2 | 5/2011 | Yamazaki et al. |
| 8,048,543 B2 | 11/2011 | Kawakami et al. |
| 8,227,097 B2 | 7/2012 | Kawakami et al. |
| 8,253,327 B2 * | 8/2012 | Ibe et al. .................... 313/512 |
| 8,445,121 B2 | 5/2013 | Kawakami et al. |
| 2001/0046611 A1 | 11/2001 | Kido et al. |
| 2001/0053426 A1 * | 12/2001 | Kamoi et al. ............... 428/1.53 |
| 2002/0030193 A1 | 3/2002 | Yamazaki et al. |
| 2002/0068191 A1 | 6/2002 | Kobayashi |
| 2002/0125817 A1 | 9/2002 | Yamazaki et al. |
| 2003/0034497 A1 | 2/2003 | Yamazaki et al. |
| 2003/0094615 A1 | 5/2003 | Yamazaki et al. |
| 2003/0107326 A1 | 6/2003 | Park et al. |
| 2003/0111666 A1 | 6/2003 | Nishi et al. |
| 2003/0116768 A1 | 6/2003 | Ishikawa |
| 2003/0146439 A1 | 8/2003 | Yamazaki et al. |
| 2003/0146695 A1 | 8/2003 | Seki |

(56) References Cited

U.S. PATENT DOCUMENTS

| | | |
|---|---|---|
| 2003/0164677 A1 | 9/2003 | Miyaguchi et al. |
| 2003/0189401 A1 | 10/2003 | Kido et al. |
| 2003/0211667 A1 | 11/2003 | Takatoku |
| 2003/0211668 A1 | 11/2003 | Takatoku |
| 2003/0230972 A1 | 12/2003 | Cok |
| 2004/0161192 A1 | 8/2004 | Hamano et al. |
| 2004/0228569 A1 | 11/2004 | Yamazaki |
| 2005/0006640 A1 | 1/2005 | Jackson et al. |
| 2005/0074631 A1 | 4/2005 | Ishida et al. |
| 2005/0084712 A1 | 4/2005 | Kido et al. |
| 2005/0084713 A1 | 4/2005 | Kido et al. |
| 2005/0093436 A1 | 5/2005 | Yamazaki |
| 2005/0098113 A1 | 5/2005 | Hayashi |
| 2005/0098207 A1 | 5/2005 | Matsumoto et al. |
| 2005/0146266 A1 | 7/2005 | Kuma et al. |
| 2005/0170208 A1 | 8/2005 | Yatsunami et al. |
| 2005/0248267 A1 | 11/2005 | Gyoutoku et al. |
| 2005/0248270 A1* | 11/2005 | Ghosh et al. .................. 313/512 |
| 2005/0263775 A1 | 12/2005 | Ikeda et al. |
| 2005/0264182 A1 | 12/2005 | Seki |
| 2005/0269578 A1 | 12/2005 | Barnes et al. |
| 2005/0275346 A1 | 12/2005 | Eida et al. |
| 2006/0008740 A1 | 1/2006 | Kido et al. |
| 2006/0043510 A1 | 3/2006 | Yamazaki et al. |
| 2006/0055314 A1 | 3/2006 | Nakamura et al. |
| 2006/0061272 A1 | 3/2006 | McCormick et al. |
| 2006/0066234 A1 | 3/2006 | Lu et al. |
| 2006/0141645 A1 | 6/2006 | Yamazaki et al. |
| 2006/0158108 A1 | 7/2006 | Hayashi |
| 2006/0273718 A1 | 12/2006 | Wang et al. |
| 2007/0020451 A1 | 1/2007 | Padiyath et al. |
| 2007/0069641 A1 | 3/2007 | Hasegawa et al. |
| 2007/0096641 A1 | 5/2007 | Hasegawa et al. |
| 2007/0159095 A1 | 7/2007 | Matsuda et al. |
| 2007/0181912 A1 | 8/2007 | Ikeda et al. |
| 2007/0200125 A1 | 8/2007 | Ikeda et al. |
| 2007/0228382 A1 | 10/2007 | Yamazaki et al. |
| 2008/0042562 A1 | 2/2008 | Hayashi |
| 2008/0116795 A1 | 5/2008 | Tsuchiya et al. |
| 2008/0258617 A1 | 10/2008 | Kobayashi |
| 2008/0290798 A1 | 11/2008 | Quesada |
| 2009/0001879 A1 | 1/2009 | Ikeda et al. |
| 2010/0148204 A1 | 6/2010 | Ikeda et al. |
| 2010/0163859 A1 | 7/2010 | Yamazaki et al. |
| 2011/0057183 A1 | 3/2011 | Ibe et al. |
| 2011/0101852 A1 | 5/2011 | Fukunaga et al. |
| 2011/0132449 A1 | 6/2011 | Ramadas et al. |
| 2011/0186825 A1 | 8/2011 | Egawa et al. |
| 2011/0233557 A1 | 9/2011 | Yamazaki et al. |

FOREIGN PATENT DOCUMENTS

| | | |
|---|---|---|
| EP | 0 999 595 A | 5/2000 |
| EP | 1 009 198 | 6/2000 |
| EP | 1 058 314 A | 12/2000 |
| EP | 1 058 484 A | 12/2000 |
| EP | 1 089 361 | 4/2001 |
| EP | 1 317 165 A | 6/2003 |
| EP | 1 351 558 | 10/2003 |
| EP | 1476000 A | 11/2004 |
| EP | 1 524 706 | 4/2005 |
| EP | 1 524 707 | 4/2005 |
| EP | 1 530 245 | 5/2005 |
| EP | 1 617 493 | 1/2006 |
| EP | 1724852 A | 11/2006 |
| JP | 03-274695 | 12/1991 |
| JP | 07-169567 A | 7/1995 |
| JP | 09-063771 | 3/1997 |
| JP | 11-307259 | 11/1999 |
| JP | 11-307264 | 11/1999 |
| JP | 2000-223276 | 8/2000 |
| JP | 2000-315580 | 11/2000 |
| JP | 2000-315581 | 11/2000 |
| JP | 2001-118674 A | 4/2001 |
| JP | 2001-357973 A | 12/2001 |
| JP | 2002-367784 | 12/2002 |
| JP | 2003-203771 A | 7/2003 |
| JP | 2003-217845 A | 7/2003 |
| JP | 2003-234291 A | 8/2003 |
| JP | 2004-134395 | 4/2004 |
| JP | 2004-341173 A | 12/2004 |
| JP | 2004-349007 | 12/2004 |
| JP | 2005-019074 | 1/2005 |
| JP | 2005-019269 A | 1/2005 |
| JP | 2005-026121 | 1/2005 |
| JP | 2005-032618 | 2/2005 |
| JP | 2005-516369 | 6/2005 |
| JP | 2005-203339 | 7/2005 |
| JP | 2006-024791 | 1/2006 |
| JP | 2006-172818 A | 6/2006 |
| JP | 2006-352095 A | 12/2006 |
| JP | 2007-059476 A | 3/2007 |
| TW | 200400777 | 1/2004 |
| TW | 1273859 | 2/2007 |
| TW | 200711844 | 4/2007 |
| WO | WO-2003/065470 | 8/2003 |
| WO | WO 2003/101155 | 12/2003 |
| WO | WO 2005/006460 | 1/2005 |
| WO | WO 2005/031798 | 4/2005 |
| WO | WO 2005/060017 | 6/2005 |
| WO | WO 2006/043678 A1 | 4/2006 |
| WO | WO-2007/015779 | 2/2007 |

OTHER PUBLICATIONS

Baldo et al., "Highly Efficient Phosphorescent Emission From Organic Electroluminescent Devices," Nature, Sep. 10, 1998, vol. 395, pp. 151-154.

Baldo et al. "Very High-Efficiency Green Organic Light-Emitting Devices Based on Electrophosphorescence," Appl. Phys. Lett. (Applied Physics Letters), Jul. 5, 1999, vol. 75, No. 1, pp. 4-6.

Tsutsui et al., "High Quantum Efficiency in Organic Light-Emitting Devices With Iridium-Complex as a Triplet Emissive Center," JPN. J. Appl. Phys. (Japanese Journal of Applied Physics), Dec. 15, 1999, vol. 38, Part 2, No. 12B, pp. L1502-L1504.

Tsuruoka et al., "Transparent Thin Film Desiccant for OLEDS," SID Digest '03: SID International Symposium Digest of Technical Papers, 2003, vol. 34, pp. 860-863.

Hung et al., "Application of an ultrathin LiF/Al bilayer in organic surface-emitting diodes," Appl. Phys. Lett. (Applied Physics Letters), Jan. 22, 2001, vol. 78, No. 4, pp. 544-546.

Notice of Allowance (U.S. Appl. No. 12/706,012) dated Aug. 25, 2011.

Claims as allowed in Notice of Allowance dated Aug. 25, 2011, (U.S. Appl. No. 12/706,012, to Ikeda et al.).

Taiwanese Office Action (Application No. 97124280) Dated May 7, 2014.

* cited by examiner

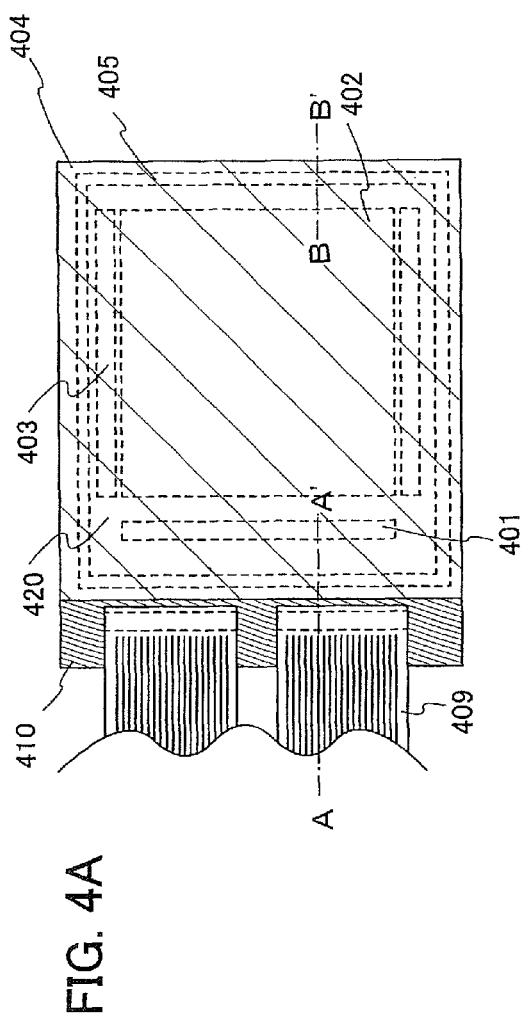
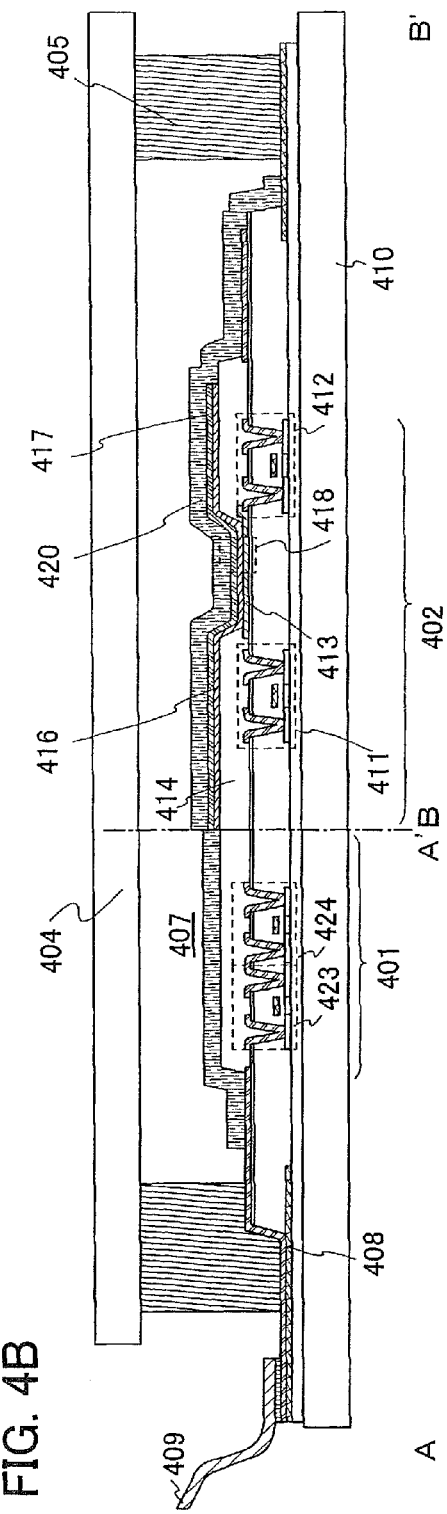
FIG. 4A
FIG. 4B

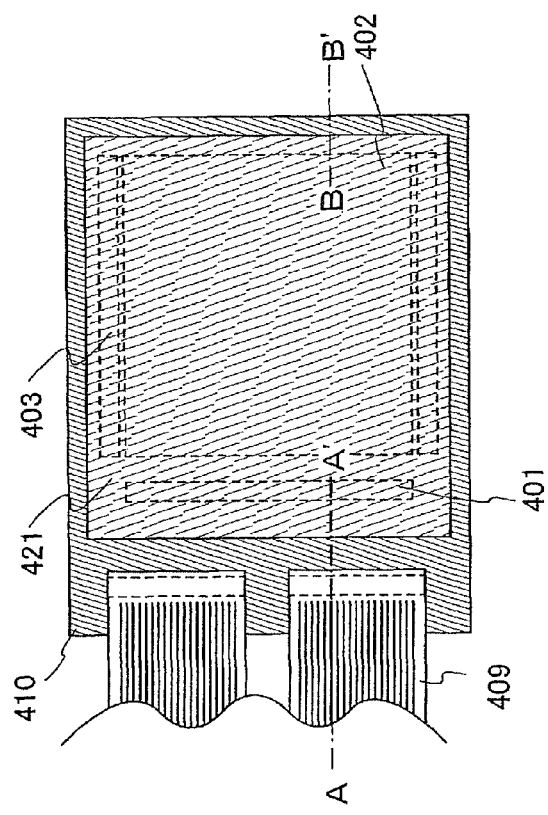
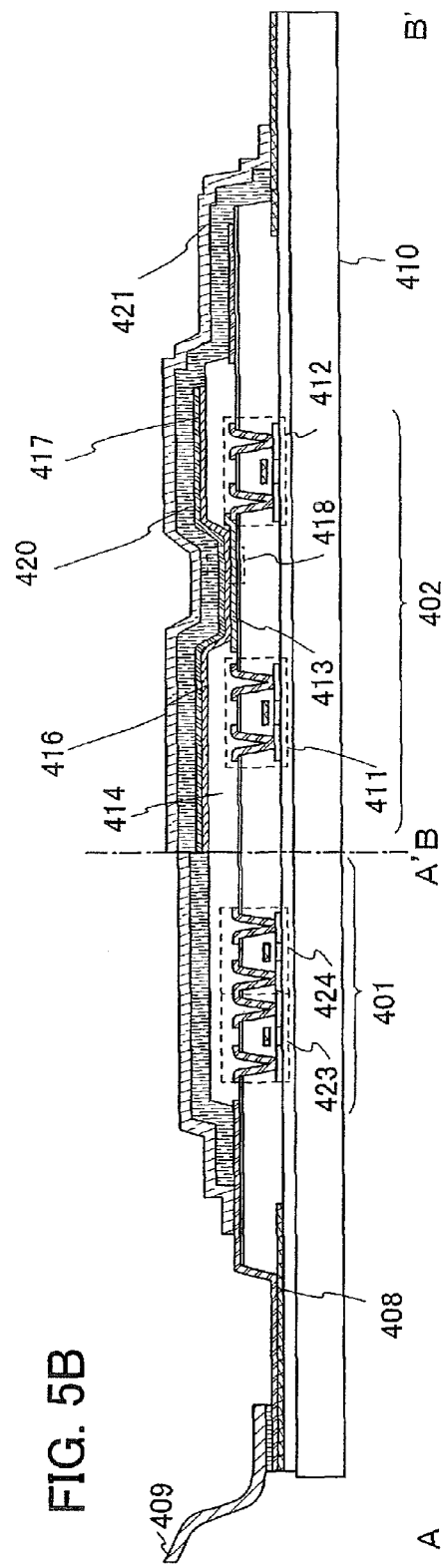
FIG. 5A
FIG. 5B

LIGHT-EMITTING ELEMENT, LIGHT-EMITTING DEVICE, ELECTRONIC DEVICE, AND METHOD FOR FABRICATING LIGHT-EMITTING ELEMENT

BACKGROUND OF THE INVENTION

1. Field of the Invention

The present invention relates to light-emitting elements utilizing electroluminescence. Further, the present invention relates to light-emitting devices and electronic devices that include the light-emitting elements and a method of fabricating the light-emitting elements.

2. Description of the Related Art

In recent years, for display units in televisions, cellular telephones, digital cameras, and the like, planar and thin display units have been demanded, and for a display unit that meets this demand, display units that use self-emitting light-emitting elements have been attracting attention. For one kind of self-emitting light-emitting element, there is a light-emitting element that uses electroluminescence; light emission from a light-emitting material can be obtained by application of a voltage to a light-emitting element where a light-emitting material is interposed between a pair of electrodes.

For this kind of self-emitting light-emitting element, pixel visibility is high compared to that of a liquid crystal display, there are advantages in that no backlight is needed and the like, and these self-emitting light-emitting elements are thought to be suitable for use as flat panel display elements. In addition, for this kind of light-emitting element, there is a significant advantage in that these light-emitting elements can be manufactured to be thin and lightweight. Furthermore, response speed being extremely fast is one of the characteristics, as well.

Moreover, because this kind of self-emitting light-emitting element can be formed into a membrane, by formation of an element with a large area, surface emission can easily be achieved. Because this characteristic cannot easily be obtained with point light sources represented by incandescent light bulbs and LEDs or with line light sources such as fluorescent lamps, the utility value for surface light sources, which can be applied to lighting and the like, is high.

Light-emitting elements that use electroluminescence are divided into whether the light-emitting material is an organic compound or an inorganic compound; generally, light-emitting elements using the former are referred to as organic EL elements, and light-emitting elements using the latter are referred to as inorganic EL elements.

When a light-emitting material is an organic compound, electrons and holes are injected into a layer containing a light-emitting organic compound from a pair of electrodes by application of a voltage to a light-emitting element so that a current flows therethrough. The electrons and holes (i.e., carriers) are recombined, and thus the light-emitting organic compound is excited. The light-emitting organic compound returns to a ground state from the excited state, thereby emitting light. Based on this mechanism, this kind of light-emitting element is called a current excitation type light-emitting element.

It is to be noted that the excited state generated by an organic compound can be a singlet excited state or a triplet excited state, and luminescence from the singlet excited state is referred to as fluorescence, and luminescence from the triplet excited state is referred to as phosphorescence.

In improving element characteristics of this kind of light-emitting element, there are a lot of problems which depend on a material, and in order to solve the problems, improvement of an element structure, development of a material, and the like have been carried out.

SUMMARY OF THE INVENTION

A problem with a light-emitting element using an organic compound is that, generally, the life of the element is short and it easily deteriorates compared to a light-emitting element using an inorganic compound. In particular, it is considered that penetration of external moisture or the like causes deterioration of a light-emitting element. Accordingly, a sealing structure has been studied.

In view of the foregoing problem, it is an object of the present invention to provide a light-emitting element that does not readily deteriorate. It is another object of the present invention to provide a light-emitting device and an electronic device which do not readily deteriorate. It is still another object of the present invention to provide a method of fabricating the light-emitting element that does not readily deteriorate.

As a result of diligent study, the present inventors have found that a layer containing an inorganic compound and halogen atoms has the effect of inhibiting moisture penetration. Thus, one aspect of the present invention is a light-emitting element including a stack structure that has a first electrode formed over a substrate, an EL layer formed over the first electrode, and a second electrode formed over the EL layer, and a first sealing layer formed so as to cover the stack structure; and the first sealing layer contains an inorganic compound and halogen atoms.

Furthermore, the present inventors have found that a layer containing an organic compound, an inorganic compound, and halogen atoms has the effect of inhibiting moisture penetration. Thus, another aspect of the present invention is a light-emitting element including a stack structure that has a first electrode formed over a substrate, an EL layer formed over the first electrode, and a second electrode formed over the EL layer, and a first sealing layer formed so as to cover the stack structure; and the first sealing layer contains an organic compound, an inorganic compound, and halogen atoms.

In the above structure, it is preferred that the organic compound be any of an aromatic amine compound, a carbazole derivative, an aromatic hydrocarbon, and a polymer compound.

In each structure described above, it is preferred that the inorganic compound be any of vanadium oxide, niobium oxide, tantalum oxide, chromium oxide, molybdenum oxide, tungsten oxide, manganese oxide, and rhenium oxide.

In each structure described above, it is preferred that the halogen atoms be fluorine atoms.

In each structure described above, it is preferred that the concentration of the halogen atoms be greater than or equal to $1\times10^{20}$ atoms/cm$^3$ and less than or equal to $1\times10^{21}$ atoms/cm$^3$.

In each structure described above, it is preferred that the thickness of the first sealing layer be greater than or equal to 0.05 μm and less than or equal to 10 μm.

Still another aspect of the present invention is a light-emitting element including a stack structure that has a first electrode formed over a substrate, an EL layer formed over the first electrode, and a second electrode formed over the EL layer, a first sealing layer formed so as to cover the stack structure, and a second sealing layer formed so as to cover the first sealing layer; and the first sealing layer contains an organic compound, an inorganic compound, and halogen atoms, and the second sealing layer is an inorganic passivation film formed of an inorganic material.

In the above structure, it is preferred that the inorganic passivation film be any of silicon nitride, silicon nitride oxide, silicon oxide, aluminum oxide, aluminum nitride, aluminum nitride oxide, and diamond-like carbon (DLC).

In each structure described above, the substrate may be flexible.

The present invention also covers a light-emitting device including the above light-emitting element. The category of the light-emitting device in this specification includes image display devices and light sources (e.g., lighting devices). Further, the category of the light-emitting device also includes modules in each of which a connector such as a flexible printed circuit (FPC), a tape automated bonding (TAB) tape, or a tape carrier package (TCP) is attached to a panel where a light-emitting element is provided; modules in each of which a printed wiring board is provided at an end of a TAB tape or a TCP; and also modules in each of which an integrated circuit (IC) is directly mounted on the light-emitting device by a chip on glass (COG) method.

Furthermore, the present invention also covers an electronic device including the above-described light-emitting device. Thus, a feature of an electronic device of the present invention is to include the above-described light-emitting device.

Another aspect of the present invention is a method of fabricating a light-emitting element including the steps of forming a first electrode, forming an EL layer over the first electrode, forming a second electrode over the EL layer, and forming a first sealing layer over the second electrode; and the step of forming the first sealing layer includes the steps of forming a layer containing an inorganic compound and adding halogen atoms to the layer containing the inorganic compound by an ion implantation process to form the first sealing layer containing the inorganic compound and the halogen atoms.

Yet another aspect of the present invention is a method of fabricating a light-emitting element including the steps of forming a first electrode, forming an EL layer over the first electrode, forming a second electrode over the EL layer, and forming a first sealing layer over the second electrode; and the step of forming the first sealing layer includes the steps of fainting a layer containing an organic compound and an inorganic compound and adding halogen atoms to the layer containing the organic compound and the inorganic compound by an ion implantation process to form the first sealing layer containing the organic compound, the inorganic compound, and the halogen atoms.

Yet still another aspect of the present invention is a method of fabricating a light-emitting element including the steps of forming a first electrode, forming an EL layer over the first electrode, forming a second electrode over the EL layer, forming a first sealing layer over the second electrode, and forming a second sealing layer over the first sealing layer; and the step of forming the first sealing layer includes the steps of forming a layer containing an organic compound and an inorganic compound and adding halogen atoms to the layer containing the organic compound and the inorganic compound by an ion implantation process to form the fight sealing layer containing the organic compound, the inorganic compound, and the halogen atoms, and the step of forming the second sealing layer is performed by a plasma CVD method, a sputtering method, or a vacuum evaporation method.

The light-emitting element of the present invention includes a layer containing an inorganic compound and halogen atoms or a layer containing an organic compound, an inorganic compound, and halogen atoms. This makes it possible to inhibit moisture penetration into the EL layer and results in the light-emitting element that does not readily deteriorate and has a long life.

Furthermore, the light-emitting element of the present invention includes an inorganic passivation film in addition to a layer containing an inorganic compound and halogen atoms or a layer containing an organic compound, an inorganic compound, and halogen atoms. This makes it possible to inhibit moisture penetration into the EL layer and results in the light-emitting element that does not readily deteriorate and has a long life.

Further, the light-emitting device of the present invention, in which moisture penetration into the EL layer can be inhibited, does not readily deteriorate and has a long life.

Furthermore, since the electronic device of the present invention has a light-emitting device that does not readily deteriorate and has a long life, the electronic device does not readily deteriorate as well.

Moreover, application of the present invention facilitates fabrication of a light-emitting element and a light-emitting device that do not readily deteriorate.

BRIEF DESCRIPTION OF THE DRAWINGS

FIGS. 4A and 4B illustrate a light-emitting device of the present invention.

FIGS. 5A and 5B illustrate a light-emitting device of the present invention.

DETAILED DESCRIPTION OF THE INVENTION

Figure 1:
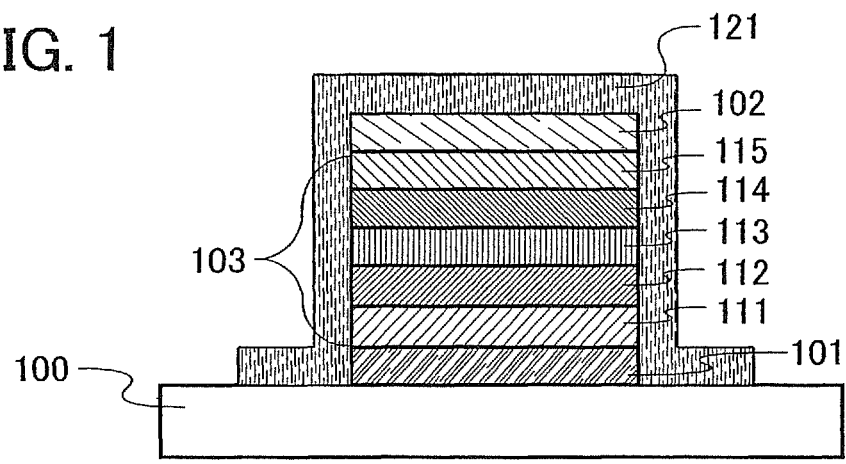
FIG. 1 illustrates a light-emitting element of the present invention.

Hereinafter, embodiment modes of the present invention are described using the accompanying drawings. It is to be noted that the present invention is not limited to the description below and that a variety of changes may be made in forms and details without departing from the spirit and the scope of the present invention. Therefore, the present invention should not be limited to the description of the embodiment modes to be given below. It is to be noted that reference numerals denoting the same portions are used in common in different drawings in the structure of the present invention described below.

(Embodiment Mode 1)

In this embodiment mode, a light-emitting element in which a first sealing layer is provided is described.

The light-emitting element of the present invention has a plurality of layers between a pair of electrodes. The plurality of layers is formed of a stack of layers formed of a substance having a high carrier-injecting property and a substance having a high carrier-transporting property. These layers are stacked so that a light-emitting region is formed in a region away from the electrodes, that is, so that recombination of carriers is performed in an area away from the electrodes.

In FIG. 1, a substrate 100 is used as a support of the light-emitting element. For the substrate 100, glass, plastic, or the like can be used. It is to be noted that any material other than these may be used as long as it functions as a support of the light-emitting element in a fabrication process of the light-emitting element. Alternatively, a flexible substrate may be used as the substrate 100.

In this embodiment mode, the light-emitting element includes a first electrode 101, a second electrode 102, an EL layer 103 provided between the first electrode 101 and the second electrode 102, and a first sealing layer 121 formed over the second electrode. In this embodiment mode, it is assumed that the first electrode 101 functions as an anode and that the second electrode 102 functions as a cathode. In other words, in the description below, it is assumed that light emission is obtained when a voltage is applied to the first electrode 101 and the second electrode 102 so that the potential of the first electrode 101 becomes higher than that of the second electrode 102.

It is preferred that the first electrode 101 be formed using any of metals, alloys, or conductive compounds with a high work function (specifically, a work function of 4.0 eV or higher is preferable), a mixture thereof, or the like. Specifically, indium tin oxide (ITO), indium tin oxide containing silicon or silicon oxide, indium zinc oxide (IZO), indium oxide containing tungsten oxide and zinc oxide (IWZO), and the like are given, for example. Films of such conductive metal oxide are typically formed by sputtering, but may also be formed by application of a sol-gel process or the like. For example, a film of indium zinc oxide (IZO) film can be formed using a target in which 1 wt % to 20 wt % of zinc oxide is added to indium oxide by a sputtering method. A film of indium oxide containing tungsten oxide and zinc oxide (IWZO) can be formed using a target in which 0.5 wt % to 5 wt % of tungsten oxide and 0.1 wt % to 1 wt % of zinc oxide are added to indium oxide by a sputtering method. Furthermore, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), and the like are given.

There is no particular limitation on a stacked structure of the EL layer 103. It is acceptable as long as the EL layer 103 is formed by any combination of layers each containing a substance having a high electron-transporting property, a substance having a high hole-transporting property, a substance having a high electron-injecting property, a substance having a high hole-injecting property, a bipolar substance (a substance having a high electron-transporting and hole-transporting property), or the like. For example, any combination of a hole-injecting layer, a hole-transporting layer, a light-emitting layer, an electron-transporting layer, an electron-injecting layer, and the like can be employed. Materials for each layer are exemplified below.

A hole-injecting layer 111 is a layer that contains a substance having a high hole-injecting property. As the hole-injecting layer described in this embodiment mode, a layer containing a composite material of an organic compound with a high hole-transporting property and an inorganic compound with an electron accepting property can be used.

In this specification, "composite" refers not only to a state in which two materials are simply mixed but also a state in which two materials are mixed and charges are transferred between the materials.

A transition metal oxide is given as the inorganic compound with an electron-accepting property, which is to be used for the composite material. Further, oxides of metals that belong to Group 4 to Group 8 of the periodic table are given. Specifically, use of vanadium oxide, niobium oxide, tantalum oxide, chromium oxide, molybdenum oxide, tungsten oxide, manganese oxide, or rhenium oxide is preferable because of their high electron accepting properties. In particular, use of molybdenum oxide is preferable because of its stability in the atmosphere, a low hygroscopic property, and ease of handling.

As the organic compound with a high hole-transporting property, which is to be used for the composite material, any of a variety of compounds such as aromatic amine compounds, carbazole derivatives, aromatic hydrocarbons, or polymer compounds (e.g., oligomers, dendrimers, or polymers) can be used. It is to be noted that, as the organic compound to be used for the composite material, a substance having a hole mobility of greater than or equal to $10^{-6}$ $CM^2$/(V·s) is preferably used. However, any substance other than the above substances may also be used as long as it is a substance in which the hole-transporting property is higher than the electron-transporting property. Specific examples of the organic compound that can be used for the composite material are given below.

Examples of the aromatic amine compounds that can be used for the composite material include N,N'-bis(4-methylphenyl)(p-tolyl)-N,N'-diphenyl-p-phenylenediamine (abbreviated to DTDPPA), 4,4'-bis[N-(4-diphenylaminophenyl)-N-phenylamino]biphenyl (abbreviated to DPAB), 4,4'-bis(N-{4-[N',N'-bis(3-methylphenyl)aminophenyl]-N-phenyl}amino)biphenyl (abbreviated to DNTPD), 1,3,5-tris[N-(4-diphenylaminophenyl)-N-phenylamino]benzene (abbreviated to DPA3B), and the like.

Examples of the carbazole derivatives that can be used for the composite material include 3-[N-(9-phenylcarbazol-3-yl)-N-phenylamino]-9-phenylcarbazole (abbreviated to PCzPCA1), 3,6-bis[N-(9-phenylcarbazol-3-yl)-N-phenylamino]-9-phenylcarbazole (abbreviated to PCzPCA2), 3-[N-(1-naphtyl)-N-(9-phenylcarbazol-3-yl)amino]-9-phenylcarbazole (abbreviated to PCzPCN1), and the like.

Moreover, examples of the carbazole derivatives that can be used for the composite material also include 4,4'-di(N-carbazolyl)biphenyl (abbreviated to CBP), 1,3,5-tris [4-(N-carbazolyl)phenyl]benzene (abbreviated to TCPB), 9-[4-(10-phenyl-9-anthryl)phenyl]-9H-carbazole (abbreviated to CzPA), 1,4-bis[4-(N-carbazolyl)phenyl]-2,3,5,6-tetraphenylbenzene, and the like.

Examples of the aromatic hydrocarbons that can be used for the composite material include 2-tert-butyl-9,10-di(2-naphthyl)anthracene (abbreviated to t-BuDNA), 2-tert-butyl-9,10-di(1-naphthyl)anthracene, 9,10-bis(3,5-diphenylphenyl)anthracene (abbreviated to DPPA), 2-tert-butyl-9,10-bis(4-phenylphenyl)anthracene (abbreviated to t-BuDBA), 9,10-di(2-naphthyl)anthracene (abbreviated to DNA), 9,10-diphenylanthracene (abbreviated to DPAnth), 2-tert-butylanthracene (abbreviated to t-BuAnth), 9,10-bis(4-methyl-1-naphthyl)anthracene (abbreviated to DMNA), 9,10-bis [2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides these compounds, pentacene, coronene, or the like can also be used. As described above, use of an aromatic hydrocarbon which has a hole mobility of greater than or equal to $1\times10^{-6}$ $cm^2$/(V·s) and has 14 to 42 carbon atoms is more preferable.

It is to be noted that the aromatic hydrocarbons which can be used for the composite material may have a vinyl skeleton. Examples of the aromatic hydrocarbons having a vinyl skeleton include 4,4'-bis(2,2-diphenylvinyl)biphenyl (abbreviated to DPVBi), 9,10-bis[4-(2,2-diphenylvinyl)phenyl]anthracene (abbreviated to DPVPA), and the like.

For the hole-injecting layer 111, a polymer compound (e.g., an oligomer, a dendrimer, or a polymer) can be used. Specifically, polymer compounds such as poly(N-vinylcarbazole) (abbreviated to PVK), poly(-vinyltriphenylamine) (abbreviated to PVTPA), poly[N-(4-{N'-[4-(4-diphenylamino)phenyl]phenyl-N'-phenylamino}phenyl)methacrylamide] (abbreviated to PTPDMA), and poly[N,N'-bis(4-butylphenyl)-N,N'-bis(phenyl)benzidine] (abbreviated to Poly-TPD) are given.

A hole-transporting layer 112 is a layer that contains a substance having a high hole-transporting property. Examples of the substance having a high hole-transporting property include aromatic amine compounds such as 4,4'-bis[N-(1-naphthyl)-N-phenylamino]biphenyl (abbreviated to NPB or α-NPD), N,N'-bis(3-methylphenyl)-N,N'-diphenyl-[1,1'-biphenyl]-4,4'-diamine (abbreviated to TPD), 4,4',4"-tris(N,N-diphenylamino)triphenylamine (abbreviated to TDATA), 4,4',4"-tris[N-(3-methylphenyl)-N-phenylamino]triphenylamine (abbreviated to MTDATA), and 4,4'-bis[N-(spiro-9,9'-bifluoren-2-yl)-N-phenylamino]-1,1'-biphenyl (abbreviated to BSPB). These substances described here are mainly substances each having a hole mobility of $10^{-6}$ cm$^2$/Vs or more. However, any substance other than the above substances may also be used as long as it is a substance in which the hole-transporting property is higher than the electron-transporting property. The layer that contains a substance having a high hole-transporting property is not limited to a single layer and may be a stack of two or more layers each formed of the aforementioned substance.

For the hole-transporting layer 112, a polymer compound such as PVK, PVTPA, PTPDMA, or Poly-TPD can be used alternatively.

A light-emitting layer 113 is a layer that contains a substance with a high light-emitting property. As a substance with a high light-emitting property, a fluorescent compound that emits fluorescence or a phosphorescent compound that emits phosphorescence can be used.

As the phosphorescent compound that can be used for the light-emitting layer, for example, as a blue light-emitting material, bis[2-(4',6'-difluorophenyl)pyridinato-N,C$^{2'}$]iridium(III)tetrakis(1-pyrazolyl)borate (abbreviated to FIr6), bis[2-(4',6'-difluorophenyl)pyridinato-N,C$^{2'}$]iridium(HDpicolinate (abbreviated to Flrpic), bis{2-[3',5'-bis(trifluoromethyl)phenyl]pyridinato-N,C$^{2'}$}iridium(III)picolinate (abbreviated to Ir(CF$_3$ppy)$_2$(pic)), bis[2-(4',6'-difluorophenyl)pyridinato-N,C$^{2'}$]iridium(III)acetylacetonate (abbreviated to FTr(acac)), and the like are given. As a green light-emitting material, tris(2-phenylpyridinato-N, C$^{2'}$)iridium(III) (abbreviated to Ir(ppy)$_3$), bis(2-phenylpyridinato-N,C$^{2'}$)iridium(III) acetylacetonate (abbreviated to Ir(ppy)$_2$(acac)), bis(1,2-diphenyl-1H-benzimidazolato)iridium(III)acetylacetonate (abbreviated to Ir(pbi)$_2$(acac)), bis(benzo[h]quinolinato) fridium(III)acetylacetonate (abbreviated to Ir(bzq)$_2$(acac)), and the like are given. As a yellow light-emitting material, bis(2,4-diphenyl-1,3-oxazolato-N,C')iridium(III)acetylacetonate (abbreviated to Ir(dpo)$_2$(acac)), bis{2- [4'-(perfluorophenylphenyl)pyridinato-N,C$^{2'}$]iridium(III)acetylacetonate (abbreviated to Ir(p-PF-ph)$_2$(acac)), bis(2-phenylbenzothiazolato-N,C$^{2'}$)iridium(III)acetylacetonate (abbreviated to Ir(bt)$_2$(acac)), and the like. As an orange light-emitting material, tris(2-phenylquinolinato-N,C$^{2'}$)iridium(III) (abbreviated to Ir(pq)$_3$), bis(2-phenylquinolinato-N,C$^{2'}$)iridium(pacetylacetonate (abbreviated to Ir(pq)$_2$(acac)), and the like are given. As a red light-emitting material, organic metal complexes such as bis [2-(2'-benzo [4,5-α]thienyl)pyridinato-N,C$^{3'}$)iridium(III)acetylacetonate (abbreviated to Ir(btp)$_2$(acac)), bis(1-phenylisoquinolinato-N,C$^{2'}$)iridium (III)acetylacetonate (abbreviated to Ir(piq)$_2$(acac)), (acetylacetonato)bis [2,3-bis(4-fluorophenyl)quinoxalinato] iridium(III) (abbreviated to Ir(Fdpq)$_2$(acac)), and 2,3,7,8,12,13, 17,18-octaethyl-21H,23H-porphine platinum(II) (abbreviated to PtOEP) are given. In addition, rare-earth metal complex such as tris(acetylacetonato)(monophenanthroline)terbium(III) (abbreviated to Tb(acac)$_3$(Phen)), tris (1,3-diphenyl-1,3-propanedionato)(monophenanthroline) europium(III) (abbreviated to Eu(DBM)$_3$(Phen)), or tris [1-(2-thenoyl)-3,3,3-trifluoroacetonato](monophenanthroline) europium(III) (abbreviated to Eu(TTA)$_3$(Phen)) performs light emission (electron transition between different multiplicities) from a rare-earth metal ion; therefore, such a rare-earth metal complex can be used as the phosphorescent compound.

As the fluorescent compound which can be used for the light-emitting layer, for example, as a blue light-emitting material, N,N'-bis[4-(9H-carbazol-9-yl)phenyl]-NN'-diphenylstilbene-4,4'-diamine (abbreviated to YGA2S), 4-(9H-carbazol-9-yl)-4'-(10-phenyl-9-anthryl)triphenylamine (abbreviated to YGAPA), and the like are given. As a green light-emitting material, N-(9,10-diphenyl-2-anthryl)-N,9-diphenyl-9H-carbazol-3-amine (abbreviated to 2PCAPA), N-[9,10-bis(1,1'-biphenyl-2-yl)-2-anthryl]-N,9-diphenyl-9H-carbazol-3-amine (abbreviated to 2PCABPhA), N-(9,10-diphenyl-2-anthryl)-N,N',N'-triphenyl-1,4-phenylenediamine (abbreviated to 2DPAPA), N-[9,10-bis(1,1'-biphenyl-2-yl)-2-anthryl]-N,N',N'-triphenyl-1,4-phenylenediamine (abbreviated to 2DPABPhA), N-[9,10-bis(1,1'-biphenyl-2-yl)]-N-[4-(9H-carbazol-9-yl)phenyl]-N-phenylanthracene-2-amine (abbreviated to 2YGABPhA), N,N,9-triphenylanthracen-9-amine (abbreviated to DPhAPhA), and the like are given. As a yellow light-emitting material, rubrene; 5,12-bis (1,1'-biphenyl-4-yl)-6,11-diphenyltetracene (abbreviated to BPT), and the like are given. As a red light-emitting material, N,N,N',N'-tetrakis(4-methylphenyl)tetracene-5,11-diamine (abbreviated to p-mPhTD), 7,13-diphenyl-N,N,N',N'-tetrakis (4-methylphenyl)acenaphtho[1,2-a]fluoranthene-3,10-diamine (abbreviated to p-mPhAFD), and the like are given.

Alternatively, a substance with a high light-emitting property can be dispersed in another substance. By use of a structure in which a substance with a high light-emitting property is dispersed in another substance, crystallization of the light-emitting layer can be inhibited. Further, concentration quenching which results from the high concentration of the substance with a high light-emitting property can also be suppressed.

When a light-emitting substance is a fluorescent compound, a substance having singlet excitation energy (the energy difference between a ground state and a singlet excited state) higher than that of the fluorescent compound is preferably used as a substance in which a light-emitting substance is to be dispersed. On the other hand, when a light-emitting substance is a phosphorescent compound, a substance having triplet excitation energy (the energy difference between a ground state and a triplet excited state) higher than that of the phosphorescent compound is preferably used as a substance in which a light-emitting substance is to be dispersed.

An electron-transporting layer 114 is a layer that contains a substance having a high electron-transporting property. For example, it is possible to use a metal complex having a quinoline skeleton or a benzoquinoline skeleton or the like, such as tris(8-quinolinolato)aluminum (abbreviated to Alq), tris(4-methyl-8-quinolinolato)aluminum (abbreviated to Almq$_3$), bis(10-hydroxybenzo[h]quinolinato)beryllium (abbreviated to BeBq$_2$), or bis(2-methyl-8-quinolinolato)(4-phenylphenolato)aluminum (abbreviated to BAlq). Alternatively, a metal complex or the like having an oxazole-based or thiazole-based ligand, such as bis[2-(2-hydroxyphenyl)benzoxazolato]zinc (abbreviated to Zn(BOX)$_2$) or bis[2-(2-hydroxyphenyl)benzothiazolato]zinc (abbreviated to Zn(BTZ)$_2$) can also be used. Instead of the metal complex, 2-(4-biphenylyl)-5-(4-tert-butylphenyl)-1,3,4-oxadiazole (abbreviated to PBD), 1,3-bis[5-(p-tert-butylphenyl)-1,3,4-oxadiazol-2-yl]benzene (abbreviated to OXD-7), 3-(4-biphenylyl)-4-phenyl-5-(4-tert-butylphenyl)-1,2,4-triazole (abbreviated to TAZ), bathophenanthroline (abbreviated to BPhen), bathocuproine (abbreviated to BCP), or the like can also be used. The substances described here are mainly substances each having an electron mobility of greater than or equal to $10^{-6}$ cm$^2$/Vs. However, any substance other than the above substances may also be used as long as it is a substance in which the electron-transporting property is higher than the hole-transporting property. Furthermore, the electron-transporting layer is not limited to a single layer and may be a stack of two or more layers each formed of the aforementioned substance.

For the electron-transporting layer 114, a polymer compound can be used. For example, poly[(9,9-dihexylfluorene-2,7-diyl)-co-(pyridine-3,5-diyl)] (abbreviated to PF-Py), poly[(9,9-dioctylfluorene-2,7-diyl)-co-(2,2'-bipyridine-6,6'-diyl)] (abbreviated to PF-BPy), or the like can be used.

An electron-injecting layer 115 may be provided. For the electron-injecting layer 115, an alkali metal compound or an alkaline earth metal compound such as lithium fluoride (LiF), cesium fluoride (CsF), or calcium fluoride (CaF$_2$) can be used. Furthermore, a layer in which a substance having an electron-transporting property is combined with an alkali metal or an alkaline earth metal can be employed. For example, it is possible to use a layer made of Alq in which magnesium (Mg) is contained. It is more preferable to use the layer in which a substance having an electron-transporting property is combined with an alkali metal or an alkaline earth metal as the electron-injecting layer, since electron injection from the second electrode 102 efficiently proceeds.

The second electrode 102 can be formed using a metal, an alloy, or a conductive compound with a low work function (specifically, a work function of 3.8 eV or lower is preferable), a mixture of them, or the like. Specific examples of such cathode materials include elements belonging to Group 1 and 2 of the periodic table, i.e., alkali metals such as lithium (Li) and cesium (Cs) and alkaline earth metals such as magnesium (Mg), calcium (Ca), and strontium (Sr); alloys of them (e.g., MgAg and AlLi); rare earth metals such as europium (Eu) and ytterbium (Yb), alloys of them; and the like. Films containing an alkali metal, an alkaline earth metal, or an alloy thereof can be formed by a vacuum evaporation method. Alternatively, films containing an alkali metal, an alkaline earth metal, or an alloy thereof can also be formed by a sputtering method. Further alternatively, a film can be formed using a silver paste by a droplet discharging method or the like.

Further, when the electron-injecting layer 115 is provided between the second electrode 102 and the electron-transporting layer 114, any of a variety of conductive materials such as Al, Ag, ITO, or ITO containing silicon or silicon oxide can be used for the second electrode 102 regardless of its work function. These conductive materials can be deposited by a sputtering method, a droplet discharging method, a spin coating method, or the like.

The first sealing layer 121 is a layer capable of inhibiting moisture penetration. The sealing layer described in this embodiment mode contains an inorganic compound such as molybdenum oxide, vanadium oxide, ruthenium oxide, tungsten oxide, or manganese oxide. The sealing layer capable of inhibiting moisture penetration can be formed by addition of halogen atoms to such an inorganic compound.

Alternatively, for the first sealing layer 121, a sealing layer capable of inhibiting moisture penetration can be formed by addition of halogen atoms to the composite material used for the above-mentioned hole-injecting layer.

Chlorine, bromine, iodine, and the like are given as halogen atoms used for the first sealing layer 121. In particular, fluorine, which is highly effective in inhibiting moisture penetration, is preferably used.

After formation of a layer containing an inorganic compound or a layer containing an organic compound and an inorganic compound, halogen atoms is added thereto, whereby the first sealing layer 121 can be formed. The layer containing the inorganic compound or the layer containing the organic compound and the inorganic compound can be formed by any of a variety of methods. For example, dry processes such as a resistive heating evaporation method and an electron beam evaporation method, wet processes such as a spin coating method and a droplet discharging method, and the like are given.

For the addition of halogen atoms, although any of a variety of methods can be used, use of an ion implantation process is preferable. It is preferred that the halogen atoms be contained in the first sealing layer. 121 at a concentration of greater than or equal to $1\times10^{19}$ atoms/cm$^3$, particularly, greater than or equal to $1\times10^{20}$ atoms/cm$^3$ and less than or equal to $1\times10^{21}$ atoms/cm$^3$.

In order to obtain an effect of inhibiting moisture penetration, it is preferred that the layer inhibiting moisture penetration described in this embodiment mode have a thickness of greater than or equal to 0.05 µm and less than or equal to 10 µm, more preferably, greater than or equal to 0.02 µm and less than or equal to 1 µm.

In the light-emitting element having the above structure described in this embodiment mode, application of a voltage between the first electrode 101 and the second electrode 102 makes a current flow, whereby holes and electrons are recombined in the light-emitting layer 113 which is a layer that contains a substance having a high light-emitting property, and light is emitted. That is, a light-emitting region is formed in the light-emitting layer 113.

Light is extracted outside through one or both of the first electrode 101 and the second electrode 102. Thus, one or both of the first electrode 101 and the second electrode 102 are light-transmitting electrodes. When only the first electrode 101 is a light-transmitting electrode, light is extracted from the substrate side through the first electrode 101. In contrast, when only the second electrode 102 is a light-transmitting electrode, light is extracted from a side opposite to the substrate side through the second electrode 102. When both the first electrode 101 and the second electrode 102 are light-transmitting electrodes, light is extracted from both the substrate side and the side opposite to the substrate side through the first electrode 101 and the second electrode 102.

In the light-emitting element described in this embodiment mode, in consideration of an effect of light absorption into the first sealing layer 121, it is preferred that only the first electrode 101 be a light-transmitting electrode to extract light only from the substrate side.

Although FIG. 1 shows a structure in which the first electrode 101 that functions as an anode is provided on the substrate 100 side, the second electrode 102 that functions as a cathode may be provided on the substrate 100 side. For example, the second electrode 102 that functions as a cathode, the EL layer 103, and the first electrode 101 that functions as an anode may be stacked in this order over the substrate 100, and the EL layer 103 may have a structure in which the layers are stacked in the reverse order of that shown in FIG. 1.

Any of a variety of methods can be employed for forming the EL layer regardless of whether it is a dry process or a wet process. Further, different formation methods may be employed for each electrode or layer. Among dry processes are a vacuum evaporation method, a sputtering method, and the like. Among wet processes are an inkjet method, a spin-coating method, and the like.

For example, the EL layer may be formed using any of the polymer compounds among the above described materials by a wet process. The EL layer can alternatively be formed using a low molecular weight compound by a wet process. Further alternatively, the EL layer may be formed using a low molecular weight organic compound by a dry process such as a vacuum evaporation method.

The electrodes may also be formed by a wet process such as a sol-gel process or by a wet process using a paste of a metal material. Alternatively, the electrodes may also be formed by a dry process such as a sputtering method or a vacuum evaporation method.

It is to be noted that when the light-emitting element described in this embodiment mode is applied to a display unit and its light-emitting layer is selectively deposited according to each color, the light-emitting layer is preferably formed by a wet process. Formation of the light-emitting layer by an inkjet method allows selective deposition of the light-emitting layer for each color to be easily performed even in the case of a large substrate and results in an improvement in productivity.

Hereinafter, a method of fabricating the light-emitting element is described in specific terms.

For example, the structure shown in FIG. 1 can be obtained by formation of the first electrode 101 by a sputtering method which is a dry process, formation of the hole-injecting layer 111 and the hole-transporting layer 112 by an inkjet method or a spin coating method which is a wet process, formation of the light-emitting layer 113 by an inkjet method which is a wet process, formation of the electron-transporting layer 114 and the electron-injecting layer 115 by a vacuum evaporation method which is a dry process, and formation of the second electrode 102 by a vacuum evaporation method which is a dry process. Further, after the second electrode is formed, the layer containing an inorganic compound or the layer containing an organic compound and an inorganic compound is deposited by a vacuum evaporation method, and halogen atoms are added to the layer by an ion implantation process, whereby the first sealing layer 121 can be formed. That is, it is possible to form the hole-injecting layer 111 to the light-emitting layer 113 by wet processes over the substrate where the first electrode 101 is formed in a desired shape and to form the electron-transporting layer 114 to the second electrode 102 and the first sealing layer 121 by dry processes. In this method, the hole-injecting layer 111 to the light-emitting layer 113 can be formed at atmospheric pressure and the light-emitting layer 113 can be formed separately for each color with ease. In addition, the electron-transporting layer 114 to the second electrode 102 and the first sealing layer 121 can be successively formed in vacuum. Therefore, the process can be simplified, and productivity can be improved.

In this embodiment mode, the light-emitting element is formed over a substrate formed of glass, plastic, or the like.

By formation of a plurality of such light-emitting elements over one substrate, a passive matrix light-emitting device can be manufactured. Alternatively, for example, thin film transistors (TFTs) are formed over a substrate formed of glass, plastic, or the like, and light-emitting elements may be fabricated over electrodes that are electrically connected to the TFTs. Accordingly, an active matrix light-emitting device in which drive of the light-emitting elements is controlled by the TFTs can be manufactured. There is no particular limitation on the structure of the TFTs, and either staggered TFTs or inversely staggered TFTs may be employed. In addition, a driver circuit formed over a TFT substrate may include both n-channel and p-channel TFTs or either n-channel or p-channel TFTs. Further, there is no particular limitation on the crystallinity of a semiconductor film used for the TFTs, and either an amorphous semiconductor film or a crystalline semiconductor film may be used. Alternatively, a single crystal semiconductor film may be used. The single crystal semiconductor film can be formed by a Smart Cut method or the like.

The light-emitting element of the present invention includes the layer containing an inorganic compound and halogen atoms or the layer containing an organic compound, an inorganic compound, and halogen atoms. This makes it possible to inhibit moisture penetration into the EL layer and results in the light-emitting element that does not readily deteriorate and has a long life.

This embodiment mode can be combined with any other embodiment mode as appropriate.

(Embodiment Mode 2)

Figure 2:
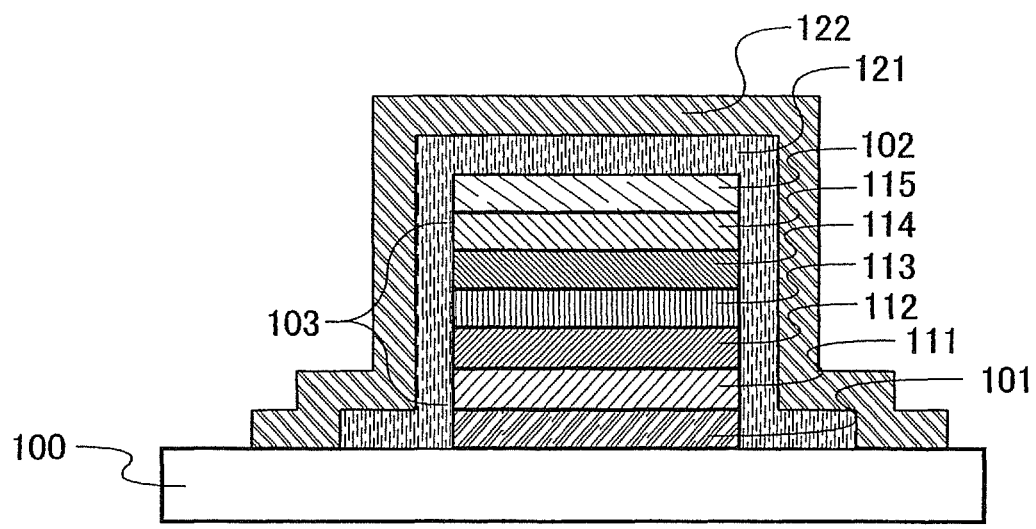
FIG. 2 illustrates a light-emitting element of the present invention.

In this embodiment mode, a light-emitting element in which a second sealing layer is provided is described using FIG. 2.

In this embodiment mode, a light-emitting element includes the first electrode 101, the second electrode 102, the EL layer 103 provided between the first electrode 101 and the second electrode 102; the first sealing layer 121 formed over the second electrode, and a second sealing layer 122 formed over the first sealing layer 121. That is, the light-emitting element of this embodiment mode includes a second sealing layer that is formed so as to cover the light-emitting element described in Embodiment Mode 1.

The second sealing layer 122 is a passivation film formed of an inorganic compound and has low moisture/oxygen permeability and superior mechanical strength. Specifically, silicon nitride, silicon nitride oxide, silicon oxide, aluminum oxide, aluminum nitride, aluminum nitride oxide, diamond-like carbon (DLC), or the like can be used. Alternatively, a stacked film in which two or more kinds of films of the above compounds are combined can be used.

It is necessary that the second sealing layer 122 be formed while thermal damage to the light-emitting element is reduced. Specifically, the substrate temperature at the time of the formation is preferably 100° C. or less.

A plasma CVD method, a sputtering method, a vacuum evaporation method, or the like can be applied to the formation of the second sealing layer 122.

Usually, in formation of a passivation film directly on the second electrode, the stress of the passivation film may cause film peeling between the second electrode and the EL layer; however, in this embodiment mode, the first sealing layer 121 serves to relieve the stress, whereby damage to the EL layer can be lessened.

Furthermore, it is unlikely that the first sealing layer 121 will have defects since it is an amorphous film with low crystallinity, whereas the moisture/oxygen permeability of the first sealing layer 121 is low as compared with that of the passivation film. In contrast, in the passivation film formed of an inorganic compound, although the moisture/oxygen permeability is low, a crack or a pinhole easily occurs, and such defects can permit moisture or oxygen to permeate. Accordingly, a combination of the first sealing layer 121 and the second sealing layer 122 can prevent moisture from penetrating into the EL layer even if moisture permeates from the defect of the passivation film comprising an inorganic compound.

The light-emitting element of the present invention includes a passivation film and the layer containing an inorganic compound and halogen atoms or the layer containing an organic compound, an inorganic compound, and halogen atoms. This makes it possible to inhibit moisture penetration into the EL layer and results in the light-emitting element that does not readily deteriorate and has a long life.

This embodiment mode can be combined with any other embodiment mode as appropriate.

(Embodiment Mode 3)

In this embodiment mode, a mode of a light-emitting element in which a plurality of light-emitting units according to the present invention is stacked (hereinafter, referred to as a stacked-type element) is described with reference to FIG. 3. The light-emitting element is a stacked-type light-emitting element including a plurality of light-emitting units between a first electrode and a second electrode. Each light-emitting unit can be made to have an EL layer that is similar to that described in Embodiment Mode 1. That is, the light-emitting element described in Embodiment Mode 1 is a light-emitting element including one light-emitting unit. The light-emitting unit includes at least a light-emitting layer, and there is no particular limitation on a structure of a stack of other layers. In this embodiment mode, a light-emitting element including a plurality of light-emitting units is described.

Figure 3:
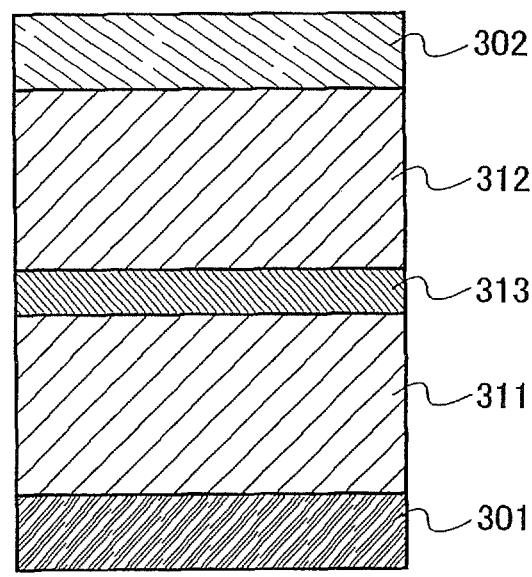
FIG. 3 illustrates a light-emitting element of the present invention.

In FIG. 3, a first light-emitting unit 311, a charge generation layer 313, and a second light-emitting unit 312 are stacked between a first electrode 301 and a second electrode 302. The first electrode 301 and the second electrode 302 can be similar to the electrodes shown in Embodiment Mode 1 or 2. The first light-emitting unit 311 and the second light-emitting unit 312 may have either the same or a different structure, which can be similar to that described in Embodiment Mode 1.

The charge generation layer 313 may contain a composite material of an organic compound and an inorganic compound. This composite material of an organic compound and an inorganic compound has been described in Embodiment Mode 1 and contains an organic compound and a metal oxide such as vanadium oxide, molybdenum oxide, or tungsten oxide. As the organic compound, any of a variety of compounds such as aromatic amine compounds, carbazole derivatives, aromatic hydrocarbons, or polymer compounds (e.g., oligomers, dendrimers, or polymers) can be used. It is to be noted that a compound having a hole mobility of $10^{-6}$ cm$^2$/(V·s) or more is preferably used as the organic compound. However, any substance other than the above compounds may also be used as long as it is a substance in which the hole-transporting property is higher than the electron-transporting property. Since the composite of an organic compound and an inorganic compound is excellent in carrier-injecting property and carrier-transporting property, low-voltage driving and low-current driving can be realized.

It is to be noted that the charge generation layer 313 may be formed by a combination of the composite material of an organic compound and an inorganic compound with another material. For example, the charge generation layer 313 may be formed by a combination of a layer containing the composite material of an organic compound and an inorganic compound, a layer containing one compound selected from among electron-donating substances, and a layer containing a compound having a high electron-transporting property. Alternatively, the charge generation layer 313 may be formed by a combination of a layer containing the composite material of an organic compound and an inorganic compound with a transparent conductive film.

In any case, any structure for the charge generation layer 313 interposed between the first light-emitting unit 311 and the second light-emitting unit 312 is acceptable as long as it is one by which electrons are injected into one of the light-emitting units and holes are injected into the other of the light-emitting units by application of a voltage between the first electrode 301 and the second electrode 302. An acceptable structure is one in which, for example, the charge generation layer 313 injects electrons into the first light-emitting unit 311 and injects holes into the second light-emitting unit 312 when a voltage is applied so that the potential of the first electrode is higher than that of the second electrode.

In this embodiment mode, the light-emitting element having two light-emitting units is described; however, the present invention can be applied in a similar manner to a light-emitting element in which three or more light-emitting units are stacked. When a plurality of light-emitting units is arranged to be partitioned from each other with a charge generation layer between a pair of electrodes, like the light-emitting element according to this embodiment mode, emission from a region of high luminance can be realized at a low current density, and thus, an element with a long life can be achieved. When the light-emitting element is applied to a lighting device, for example, a drop in voltage due to the resistance of an electrode material can be suppressed, and thus, uniform emission in a large area can be achieved. Further, a light-emitting device that can be driven at a low voltage and has low power consumption can be realized.

Furthermore, when emission colors are different between each light-emitting unit, a desired emission color can be obtained from the whole light-emitting element. For example, when an emission color of the first light-emitting unit and an emission color of the second light-emitting unit are made to be complementary colors, it is possible to obtain a light-emitting element having two light-emitting units, from which white light is emitted from the whole light-emitting element. It is to be noted that the complementary colors refer to colors that can produce an achromatic color when they are mixed. That is, white light emission can be obtained by mixture of light from substances whose emission colors are complementary colors. Similarly in a light-emitting element having three light-emitting units, for example, white light can be obtained from the whole light-emitting element when emission colors of the first, second, and third light-emitting units are red, green, and blue, respectively.

Also in the light-emitting element described in this embodiment mode, if the element is covered with the first sealing layer as described in Embodiment Mode 1 or 2, moisture penetration into the light-emitting element can be inhibited so that it does not readily deteriorate. Consequently, a light-emitting element with a long life can be obtained. Furthermore, the use of the first sealing layer and the second sealing layer can more effectively inhibit moisture penetration into the light-emitting element.

This embodiment mode can be combined with any other embodiment mode as appropriate.

(Embodiment Mode 4)

In this embodiment mode, a light-emitting device including a light-emitting element of the present invention is described.

In this embodiment mode, a light-emitting device that includes a light-emitting element of the present invention in its pixel portion is described using FIGS. 4A and 4B. FIG. 4A is a top view of the light-emitting device, and FIG. 4B is a cross-sectional view taken along lines A-A' and B-B' of FIG. 4A. The light-emitting device has a driver circuit portion (a source side driver circuit) 401, a pixel portion 402, and a driver circuit portion (a gate side driver circuit) 403 which are indicated by dotted lines to control the light-emitting device. Reference numerals 420, 404, and 405 denote a sealing layer, a sealing substrate, and a sealing material, respectively. A portion enclosed by the sealing material 405 corresponds to a space 407.

A lead wiring 408 is a wiring used to transmit signals to be inputted to the source side driver circuit 401 and the gate side driver circuit 403 and receives a video signal, a clock signal, a start signal, a reset signal, and the like from a flexible printed circuit (FPC) 409 which is an external input terminal. It is to be noted that only the FPC is illustrated in this case; however, the FPC may be provided with a printed wiring board (PWB). The category of the light-emitting device in this specification includes not only a light-emitting device itself but also a light-emitting device to which an FPC or a PWB is attached.

Next, a cross-sectional structure is described using FIG. 4B. The driver circuit portion and the pixel portion are formed over an element substrate 410. In this embodiment mode, one pixel in the pixel portion 402 and the source side driver circuit 401 which is the driver circuit portion are illustrated.

A CMOS circuit, which is a combination of an n-channel TFT 423 and a p-channel TFT 424, is formed as the source side driver circuit 401. Each driver circuit portion may be any of a variety of circuits such as a CMOS circuit, a PMOS circuit, or an NMOS circuit. Although a driver-integration type device, in which a driver circuit is formed over the substrate where the pixel portion is formed, is described in this embodiment mode, a driver circuit is not necessarily be formed over the substrate where the pixel portion is provided but can be formed externally from a substrate.

The pixel portion 402 is formed of a plurality of pixels each of which includes a switching TFT 411, a current control TFT 412, and a first electrode 413 which is electrically connected to a drain of the current control TFT 412. It is to be noted that an insulator 414 is fowled to cover end portions of the first electrode 413. In this embodiment mode, the insulator 414 is fowled using a positive photosensitive acrylic resin film.

The insulator 414 is formed so as to have a curved surface having curvature at an upper end portion or a lower end portion thereof in order to make the coverage favorable. For example, in the case of using a positive photosensitive acrylic resin as a material for the insulator 414, it is preferable that the insulator 414 be formed so as to have a curved surface with radius of curvature (0.2 μm to 3 μm) only at the upper end portion thereof. The insulator 414 can be formed using either a negative type which becomes insoluble in an etchant by light irradiation or a positive type which becomes soluble in an etchant by light irradiation.

An EL layer 416 and a second electrode 417 are formed over the first electrode 413. In this case, the first electrode 413 can be formed using any of a variety of materials such as metals, alloys, and conductive compounds or a mixture thereof. In particular, in order that the first electrode be used as an anode, it is preferably formed using any of metals, alloys, and conductive compounds with a high work function (a work function of 4.0 eV or higher), a mixture thereof, or the like. For example, it is possible to use a single-layer film of an indium tin oxide film containing silicon, an indium zinc oxide film, a titanium nitride film, a chromium film, a tungsten film, a Zn film, a Pt film, or the like; a stack of a titanium nitride film and a film containing aluminum as its main component; or a stacked film such as a film having a three-layer structure of a titanium nitride film, a film containing aluminum as its main component, and a titanium nitride film. When a stacked structure is employed, resistance as a wiring is low, a good ohmic contact is formed, and further, the first electrode 413 can be made to function as an anode.

The EL layer 416 is formed by any of a variety of methods such as an evaporation method using an evaporation mask, an inkjet method, and a spin coating method. The EL layer 416 can be made to have the structure described in Embodiment Mode 1 or 3. Further, the EL layer 416 may be formed using any of low molecular weight compounds or polymer compounds (the category of the polymer compounds includes oligomers and dendrimers). Further, the material used for the EL layer may be not only an organic compound but also an inorganic compound.

The second electrode 417 can be formed using any of a variety of metals, alloys, and conductive compounds, or a mixture thereof. When the second electrode is used as a cathode, it is preferred that the second electrode be formed using any of metals, alloys, and conductive compounds with a low work function (a work function of 3.8 eV or lower), a mixture thereof, or the like. For example, elements belonging to Group 1 and 2 of the periodic table, that is, alkali metals such as lithium (Li) and cesium (Cs) and alkaline earth metals such as magnesium (Mg), calcium (Ca), and strontium (Sr); alloys of them (e.g., MgAg and AlLi); and the like are given. It is to be noted that, when light emitted from the EL layer 416 is transmitted through the second electrode 417, for the second electrode 417, it is possible to use a stack of a metal thin film with a reduced thickness and a transparent conductive film (e.g., indium tin oxide (ITO), indium tin oxide containing silicon or silicon oxide, indium zinc oxide (IZO), or indium oxide containing tungsten oxide and zinc oxide (IWZO)).

Further, the first sealing layer 420 is formed so as to cover the second electrode 417. The first sealing layer 420 corresponds to the first sealing layer 121 described in Embodiment Mode 1. Providing the first sealing layer 420 makes it possible to inhibit moisture penetration into the light-emitting element (i.e., moisture penetration into the EL layer) so that a light-emitting device that does not readily deteriorate and has a long life can be obtained. Further still, providing the second sealing layer 122 described in Embodiment Mode 2 so as to cover the first sealing layer 121 makes it possible to inhibit moisture penetration into the light-emitting element in a more effective manner.

The sealing substrate 404 is attached using the sealing material 405 to the element substrate 410; thus, a light-emitting element 418 is provided in the space 407 enclosed by the element substrate 410, the sealing substrate 404, and the sealing material 405. It is to be noted that the space 407 is filled with a filler. The space 407 is filled with an inert gas (e.g., nitrogen or argon) or the sealing material 405 in some cases.

It is preferable that an epoxy-based resin be used to form the sealing material 405 and that such a material permeate little moisture and oxygen as much as possible. Alternatively, the sealing substrate 404 can be formed of, as well as a glass substrate or a quartz substrate, a plastic substrate made of fiberglass-reinforced plastic (FRP), polyvinyl fluoride (PVF), polyester, acrylic, or the like.

Accordingly, a light-emitting device including the light-emitting element of the present invention can be obtained.

In the light-emitting device of the present invention, which has the light-emitting element described in any of Embodiment Modes 1 to 3, deterioration by moisture penetration is inhibited, and thus, the life is long.

Furthermore, in FIGS. 4A and 4B, the sealing substrate 404 is used for further sealing after the sealing with the first sealing layer 420; thus, the structure is highly effective in inhibiting moisture penetration into the light-emitting element. In a structure in which light is extracted from the sealing substrate 404 side, it is difficult to provide a drying agent or the like for inhibiting deterioration of the light-emitting element in the space 407. Accordingly, employing the structure shown in FIGS. 4A and 4B is more effective in inhibiting moisture penetration into the light-emitting element.

The sealing substrate 404 is not necessarily provided because moisture penetration into the light-emitting element can be inhibited by the provision of the first sealing layer 420. FIGS. 5A and 5B show a structure of a light-emitting device in which the sealing substrate 404 is not provided. The structure shown in FIGS. 5A and 5B is effective if the element substrate 410 is a flexible substrate. As described in Embodiment Mode 1 or 2, the first sealing layer 420 is flexible and has the effect of relieving stress. Therefore, in the case where the element substrate 410 is flexible, it is preferred that the sealing substrate 404 be not provided and that the first sealing layer 420 be used for the sealing. In addition, as shown in FIGS. 5A and 5B, the second sealing layer 421 may be provided so as to cover the first sealing layer 420. Providing the second sealing layer 421 enables better inhibition of moisture penetration into the light-emitting element.

(Embodiment Mode 5)

In this embodiment mode, electronic devices of the present invention including the light-emitting device described in Embodiment Mode 4 are described. The electronic devices of the present invention each have a display portion that includes any of the light-emitting elements described in Embodiment Modes 1 to 3.

Examples of the electronic devices including the light-emitting elements of the present invention include cameras such as video cameras or digital cameras, goggle type displays, navigation systems, audio playback devices (e.g., car audio systems and audio systems), computers, game machines, portable information terminals (e.g., mobile computers, cellular telephones, portable game machines, and electronic books), image playback devices in which a recording medium is provided (specifically, devices that are capable of playing back recording media such as digital versatile discs (DVDs) and equipped with a display unit that can display the image), and the like. Specific examples of these electronic devices are shown in FIGS. 6A to 6D.

Figure 6A:
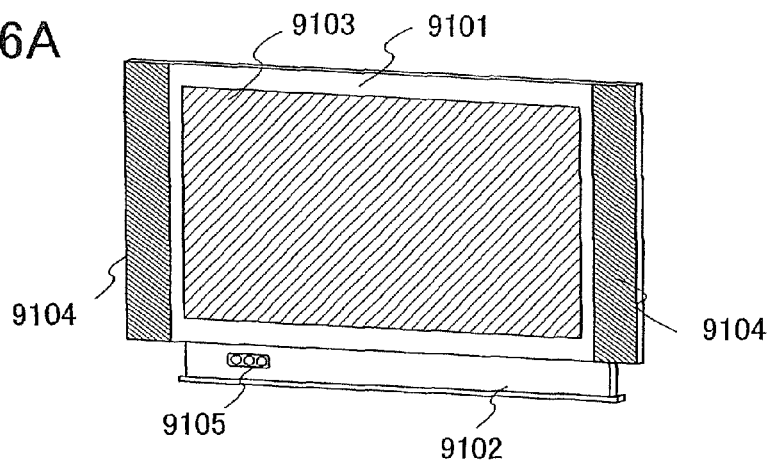
FIGS. 6A to 6D illustrate electronic devices of the present invention.

FIG. 6A shows a television device according to the present invention which includes a housing 9101, a support stand 9102, a display portion 9103, a speaker portion 9104, a video input terminal 9105, and the like. In the television device, the display portion 9103 has light-emitting elements arranged in matrix form, which are similar to those described in Embodiment Modes 1 to 3. Each light-emitting element is characterized in that moisture penetration therein is inhibited, that it has a long life, and that power consumption is low. Since the display portion 9103 formed of the light-emitting elements has similar characteristics, the television device has a long life. In addition, lower power consumption is achieved. Such characteristics contribute to a significant reduction in size and number of the power supply circuits in the television device, resulting in a reduction in the size and weight of the housing 9101 and the support stand 9102. In the television device according to the present invention, lower power consumption, a higher image quality, a smaller size, and a lighter weight are achieved; therefore, products suitable for a residence can be provided.

Figure 6B:
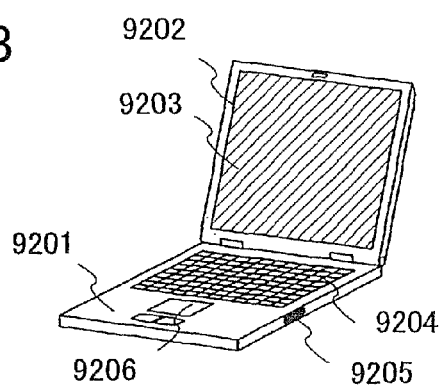

FIG. 6B shows a computer according to the present invention which includes a main body 9201, a housing 9202, a display portion 9203, a keyboard 9204, an external connection port 9205, a pointing device 9206, and the like. In the computer, the display portion 9203 has light-emitting elements arranged in matrix form, which are similar to those described in Embodiment Modes 1 to 3. Each light-emitting element is characterized in that moisture penetration therein is inhibited, that it has a long life, and that power consumption is low. Since the display portion 9203 formed of the light-emitting elements has similar characteristics, the computer has a long life. In addition, lower power consumption is achieved. Such characteristics contribute to a significant reduction in size and number of the power supply circuits in the computer, resulting in a reduction in the size and weight of the main body 9201 and the housing 9202. In the computer according to the present invention, lower power consumption, a higher image quality, a smaller size, and a lighter weight are achieved; therefore, products suitable for the environment can be supplied.

Figure 6C:
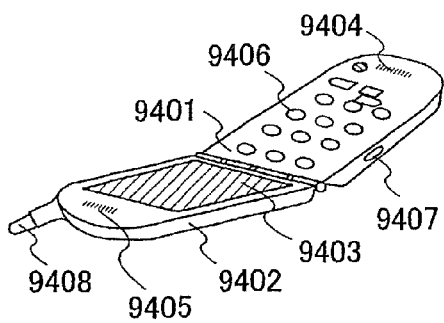

FIG. 6C shows a cellular telephone according to the present invention which includes a main body 9401, a housing 9402, a display portion 9403, an audio input portion 9404, an audio output portion 9405, operation keys 9406, an external connection port 9407, an antenna 9408, and the like. In the cellular telephone, the display portion 9403 has light-emitting elements arranged in matrix form, which are similar to those described in Embodiment Modes 1 to 3. Each light-emitting element is characterized in that moisture penetration therein is inhibited, that it has a long life, and that power consumption is low. Since the display portion 9403 formed of the light-emitting elements has similar characteristics, the cellular telephone has a long life. In addition, lower power consumption is achieved. Such characteristics contribute to a significant reduction in size and number of the power supply circuits in the cellular telephone, resulting in a reduction in the size and weight of the main body 9401 and the housing 9402. In the cellular telephone according to the present invention, lower power consumption, a higher image quality, a smaller size, and a lighter weight are achieved; therefore, products suitable for portability can be provided.

Figure 6D:
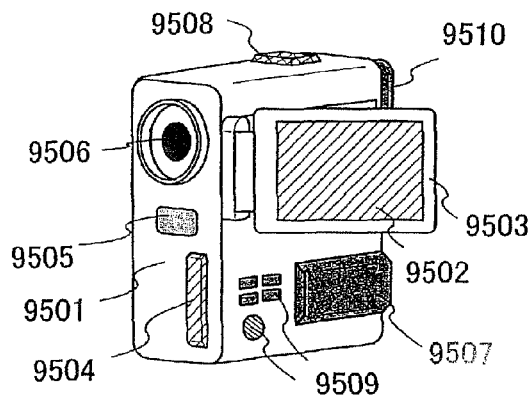

FIG. 6D shows a camera according to the present invention which includes a main body 9501, a display portion 9502, a housing 9503, an external connection port 9504, a remote control receiver 9505, an image receiver 9506, a battery 9507, an audio input portion 9508, operation keys 9509, an eye piece portion 9510, and the like. In the camera, the display portion 9502 has light-emitting elements arranged in matrix form, which are similar to those described in Embodiment Modes 1 to 3. Each light-emitting element is characterized in that moisture penetration therein is inhibited, that it has a long life, and that power consumption is low. Since the display portion 9502 formed of the light-emitting elements has similar characteristics, the camera has a long life. In addition, lower power consumption is achieved. Such characteristics contribute to a significant reduction in size and number of the power supply circuits in the camera, resulting in a reduction in the size and weight of the main body 9501. In the camera according to the present invention, lower power consumption, a higher image quality, a smaller size, and a lighter weight are achieved; therefore, products suitable for portability can be provided.

As described above, the applicable range of the light-emitting device of the present invention is extremely wide so that this light-emitting device can be applied to electronic devices of a variety of fields. By use of the light-emitting element of the present invention, an electronic device having a display portion that is not readily deteriorated by moisture penetration and has a long life can be obtained. Furthermore, an electronic device that has a display portion with low consumption can be provided.

Such a light-emitting device of the present invention can also be used as a lighting device. One mode in which the light-emitting device of the present invention is used as a lighting device is described using FIG. 7.

Figure 7:
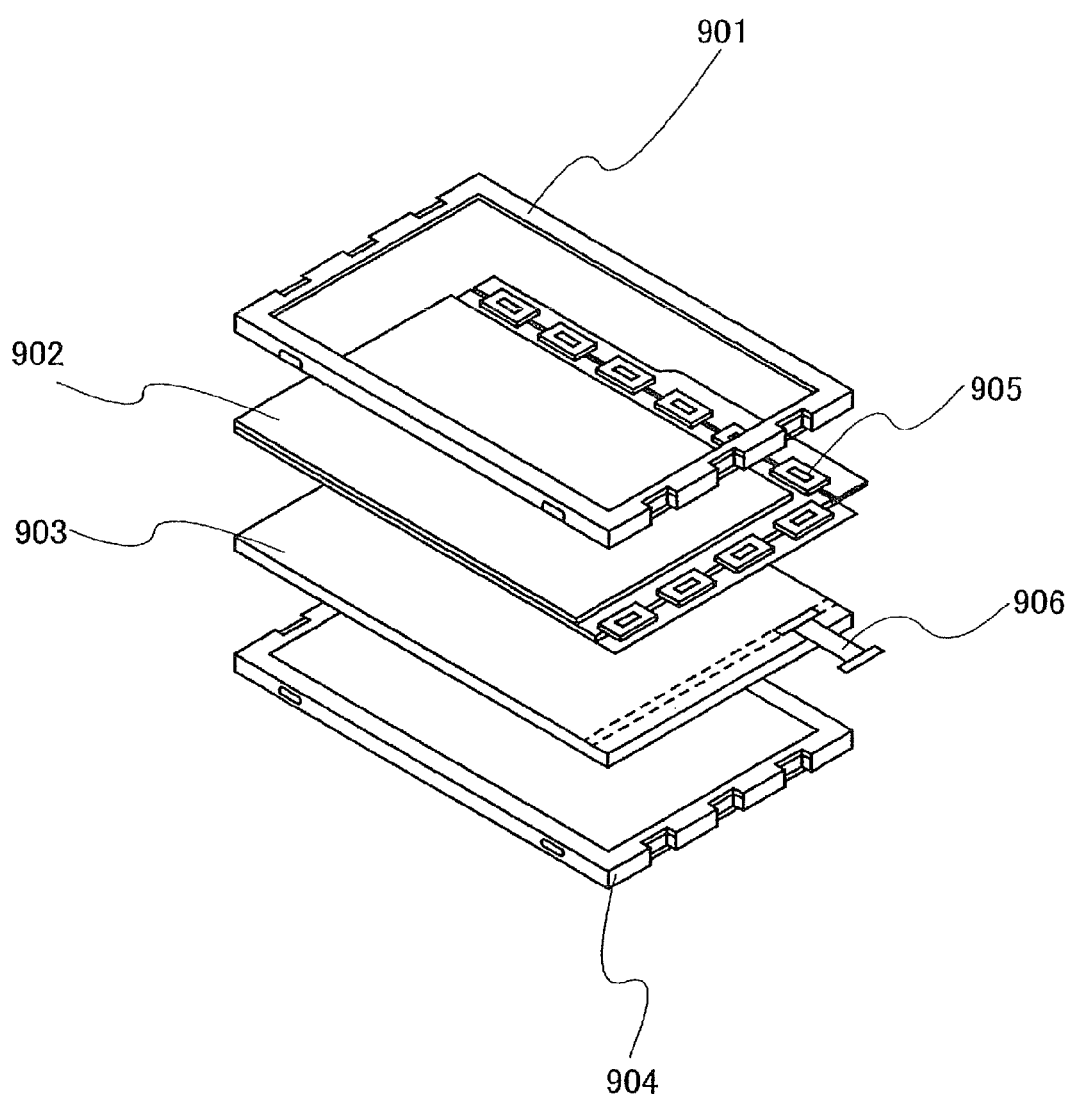
FIG. 7 illustrates an electronic device of the present invention.

FIG. 7 shows an example of a liquid crystal display device in which the light-emitting device of the present invention is used as a backlight. The liquid crystal display device shown in FIG. 7 includes a housing 901, a liquid crystal layer 902, a backlight 903, and a housing 904. The liquid crystal layer 902 is connected to a driver IC 905. The light-emitting device of the present invention is used as the backlight 903, and a current is supplied through a terminal 906.

By use of the light-emitting device of the present invention as the backlight of the liquid crystal display device, a backlight that does not readily deteriorate and has a long life can be obtained. Since the light-emitting device of the present invention is a lighting device with plane light emission and can be made to have a larger area, the backlight can be made to have a larger area, and a liquid crystal display device can also be made to have a larger area as well. Furthermore, since the light-emitting device of the present invention is thin and has low power consumption, a thinner shape and lower power consumption can also be achieved in a display device.

Figure 8:
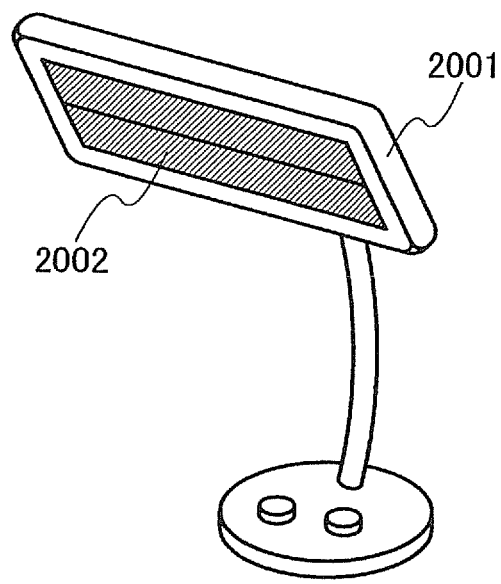
FIG. 8 illustrates a lighting device of the present invention.

FIG. 8 shows an example in which the light-emitting device to which the present invention is applied is used as a table lamp which is a lighting device. The table lamp shown in FIG. 8 has a housing 2001 and a light source 2002. The light-emitting device of the present invention is used as the light source 2002. The light-emitting device of the present invention can emit light with high luminance, and thus, it can illuminate the area where detail work or the like is being done. In addition, the light-emitting device of the present invention does not readily deteriorate and has a long life.

Figure 9:
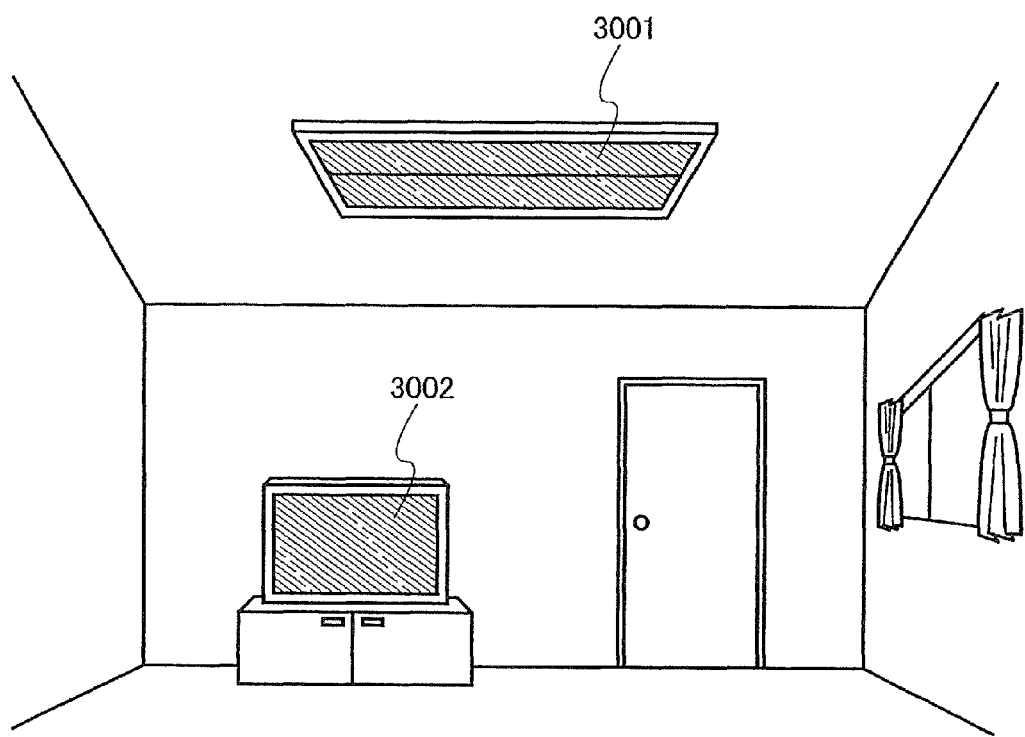
FIG. 9 illustrates a lighting device of the present invention.

FIG. 9 shows an example in which a light-emitting device to which the present invention is applied is used as an indoor lighting device 3001. Since the light-emitting device of the present invention can have a larger area, the light-emitting device of the present invention can be used as a lighting device having a large emission area. Further, since the light-emitting device of the present invention is thin and has low power consumption, the light-emitting device of the present invention can be used as a lighting device with a thinner shape and lower power consumption. A television device according to the present invention as described in FIG. 6A is placed in a room where a light-emitting device to which the present invention is thus applied is used as the indoor lighting device 3001, and public broadcasting and movies can be enjoyed. In such a case, since power consumption is low in both devices, a powerful image can be watched in a bright room without any concern about charges for electricity.

This application is based on Japanese Patent Application serial no. 2007-170319 filed with Japan Patent Office on Jun. 28, 2007, the entire contents of which are hereby incorporated by reference.

What is claimed is:

1. A method of fabricating a light-emitting element, comprising the steps of:
    forming a first electrode;
    forming an EL layer over the first electrode;
    forming a second electrode over the EL layer;
    forming a layer containing an organic compound and an inorganic compound over the second electrode; and
    adding halogen atoms to the layer containing the organic compound and the inorganic compound by ion implantation, thereby forming a first sealing layer containing the organic compound, the inorganic compound, and the halogen atoms.

2. The method of fabricating the light-emitting element according to claim 1, wherein the organic compound is any of an aromatic amine compound, a carbazole derivative, an aromatic hydrocarbon, and a polymer compound.

3. The method of fabricating the light-emitting element according to claim 1, wherein the inorganic compound is any of vanadium oxide, niobium oxide, tantalum oxide, chromium oxide, molybdenum oxide, tungsten oxide, manganese oxide, and rhenium oxide.

4. The method of fabricating the light-emitting element according to claim 1, wherein the halogen atoms are fluorine atoms.

5. The method of fabricating the light-emitting element according to claim 1, wherein a concentration of the halogen atoms is greater than or equal to $1\times10^{20}$ atoms/cm$^3$ and less than or equal to $1\times10^{21}$ atoms/cm$^3$.

6. A method of fabricating a light-emitting element, comprising the steps of:
    forming a first electrode;
    forming an EL layer over the first electrode;
    forming a second electrode over the EL layer;
    forming a layer containing an organic compound and an inorganic compound over the second electrode;
    adding halogen atoms to the layer containing the organic compound and the inorganic compound by ion implantation, thereby forming a first sealing layer containing the organic compound, the inorganic compound, and the halogen atoms over the second electrode; and
    forming a second sealing layer over the first sealing layer by one of a plasma CVD method, a sputtering method, and a vacuum evaporation method.

7. The method of fabricating the light-emitting element according to claim 6, wherein the organic compound is any of an aromatic amine compound, a carbazole derivative, an aromatic hydrocarbon, and a polymer compound.

8. The method of fabricating the light-emitting element according to claim 6, wherein the inorganic compound is any of vanadium oxide, niobium oxide, tantalum oxide, chromium oxide, molybdenum oxide, tungsten oxide, manganese oxide, and rhenium oxide.

9. The method of fabricating the light-emitting element according to claim 6, wherein the halogen atoms are fluorine atoms.

10. The method of fabricating the light-emitting element according to claim 6, wherein a concentration of the halogen atoms is greater than or equal to $1\times10^{20}$ atoms/cm$^3$ and less than or equal to $1\times10^{21}$ atoms/cm$^3$.

11. A light-emitting device comprising:
    a wiring over a first substrate;
    a first electrode over the first substrate;
    an insulator over the first electrode;
    an EL layer over the insulator;
    a second electrode over the EL layer;

a first sealing layer comprising an organic compound over the second electrode;

a sealing material over and in contact with the wiring; and a second substrate attached to the first substrate by the sealing material, wherein the first sealing layer covers the insulator and the second electrode, and wherein the organic compound is capable of being used for a composite material which can be used for the EL layer.

12. The light-emitting device according to claim 11, wherein the wiring is in contact with the first sealing layer.

13. The light-emitting device according to claim 11, wherein the organic compound is a carbazole derivative or an aromatic hydrocarbon.

14. The light-emitting device according to claim 11, wherein the first sealing layer further comprises a molybdenum oxide.

15. The light-emitting device according to claim 11, wherein the first sealing layer further comprises halogen atoms.

16. The light-emitting device according to claim 11, wherein the sealing material comprises an epoxy-based resin.

17. The light-emitting device according to claim 11, further comprising a second sealing layer over the first sealing layer, wherein the second sealing layer comprises an inorganic material, and wherein the inorganic material is any of silicon nitride, silicon nitride oxide, silicon oxide, aluminum oxide, aluminum nitride, aluminum nitride oxide, and diamond-like carbon (DLC).

18. A display device comprising the light-emitting device according to claim 11.

19. A lighting device comprising the light-emitting device according to claim 11.

20. An electronic device comprising the light-emitting device according to claim 11.

21. The light-emitting device according to claim 11, wherein the EL layer comprises a hole-injecting layer, and wherein the organic compound is contained in the hole-injecting layer.

* * * * *

UNITED STATES PATENT AND TRADEMARK OFFICE
CERTIFICATE OF CORRECTION

PATENT NO. : 8,941,301 B2  
APPLICATION NO. : 13/584116  
DATED : January 27, 2015  
INVENTOR(S) : Takahiro Ibe et al.

Page 1 of 1

It is certified that error appears in the above-identified patent and that said Letters Patent is hereby corrected as shown below:

In the Specification

At column 3, line 44, "fainting" should be --forming--;
At column 7, line 10, "(-vinyltriphenylamine)" should be --(4-vinyltriphenylamine)--;
At column 7, line 12, "methacryla mide]" should be --methacrylamide]--;
At column 7, lines 48-49, "(HDpicolinate (abbreviated to FIrpic)," should be --(III)picolinate (abbreviated to FIrpic),--;
At column 7, line 53, "FTr" should be --FIr--;
At column 7, line 55, "N,C$^2$)" should be --N,C$^{2\prime}$)--;
At column 7, line 59, "fridium" should be --iridium--;
At column 7, line 61, "N,C')" should be --N,C$^{2\prime}$)--;
At column 8, line 1, "(lII)" should be --(III)--;
At column 8, line 2, "(pacetylacetonate" should be --(III)acetylacetonate--;
At column 8, lines 24-25, "]-NN'-diphenylstilbene" should be --]-N,N'-diphenylstilbene--;
At column 10, line 30, "layer." should be --layer--;
At column 12, line 37, "102;" should be --102,--;
At column 15, line 47, "fowled" should be --formed--;
At column 15, line 49, "fowled" should be --formed--.

Signed and Sealed this
Twenty-third Day of June, 2015

Michelle K. Lee
*Director of the United States Patent and Trademark Office*